(12) United States Patent
Kang et al.

(10) Patent No.: US 9,977,713 B2
(45) Date of Patent: May 22, 2018

(54) LDPC DECODER, SEMICONDUCTOR MEMORY SYSTEM AND OPERATING METHOD THEREOF

(71) Applicants: SK hynix Inc., Gyeonggi-do (KR); Korea Advanced Institute of Science and Technology, Daejeon (KR)

(72) Inventors: Soon Young Kang, Daejeon (KR); Jae Kyun Moon, Daejeon (KR)

(73) Assignees: SK Hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 23 days.

(21) Appl. No.: 15/075,986

(22) Filed: Mar. 21, 2016

(65) Prior Publication Data

US 2016/0274971 A1    Sep. 22, 2016

Related U.S. Application Data

(60) Provisional application No. 62/136,173, filed on Mar. 20, 2015.

(30) Foreign Application Priority Data

Mar. 16, 2016    (KR) .......................... 10-2016-0031601

(51) Int. Cl.
*H03M 13/00*    (2006.01)
*G06F 11/10*    (2006.01)
(Continued)

(52) U.S. Cl.
CPC ...... *G06F 11/1068* (2013.01); *G11C 11/5642* (2013.01); *H03M 13/1108* (2013.01);
(Continued)

(58) Field of Classification Search
None
See application file for complete search history.

(56) References Cited

U.S. PATENT DOCUMENTS 8,799,742 B1 *   8/2014   Zhang ................ H03M 13/1128
                                                        714/759
8,984,376 B1 *   3/2015   Norrie .................. H03M 13/114
                                                        714/772

(Continued)

OTHER PUBLICATIONS

Kang, S., et al., Breaking the Trapping Sets in LDPC Codes: Check Node Removal and Collaborative Decoding, IEEE Transactions on Communications, Jan. 2016, pp. 15-26, vol. 64, No. 1.

(Continued)

*Primary Examiner* — Daniel McMahon
(74) *Attorney, Agent, or Firm* — IP & T Group LLP

(57) ABSTRACT

An operation method for a low density parity check (LDPC) decoder which includes performing an initial update operation to variable nodes by updating a codeword to the variable nodes, performing a decoding operation to the codeword based on an original parity check matrix, generating a modified parity check matrix by changing data of rows of the original parity check matrix corresponding to check nodes with dummy data, performing a node update operation based on the modified parity check matrix and performing a predetermined number of single iterations of the above processes until the decoding operation is successful.

15 Claims, 15 Drawing Sheets

(51) Int. Cl.
H03M 13/11 (2006.01)
H03M 13/37 (2006.01)
H03M 13/45 (2006.01)
G11C 11/56 (2006.01)
G11C 29/52 (2006.01)
G11C 29/04 (2006.01)

(52) U.S. Cl.
CPC .... *H03M 13/1111* (2013.01); *H03M 13/3707* (2013.01); *H03M 13/3723* (2013.01); *H03M 13/3746* (2013.01); *H03M 13/45* (2013.01); *H03M 13/6325* (2013.01); *G11C 29/52* (2013.01); *G11C 2029/0411* (2013.01)

(56) References Cited

U.S. PATENT DOCUMENTS

| | | | | |
|---|---|---|---|---|
| 2005/0193320 | A1* | 9/2005 | Varnica | H03M 13/1111 714/800 |
| 2008/0028274 | A1* | 1/2008 | Lin | H03M 13/1108 714/752 |
| 2011/0231731 | A1* | 9/2011 | Gross | H03M 13/1111 714/760 |
| 2013/0086445 | A1* | 4/2013 | Yedidia | H03M 13/1154 714/755 |
| 2016/0112068 | A1* | 4/2016 | Kim | H03M 13/1108 714/755 |
| 2016/0246673 | A1* | 8/2016 | Kim | H03M 13/3746 |
| 2016/0294416 | A1* | 10/2016 | Hsieh | H03M 13/1128 |
| 2017/0149446 | A1* | 5/2017 | Tao | H03M 13/1117 |

OTHER PUBLICATIONS

Gallager, R. G., Low-Density Parity-Check Codes, IRE Transactions on Information Theory, Jan. 1962, pp. 21-28, vol. 8, No. 1.
MacKay, D. J. C., et al., Near Shannon limit performance of low density parity check codes, Electronics Letters, Aug. 29, 1996, pp. 1645-1646, vol. 32, No. 18.
Chung, S., et al., On the design of low-density parity-check codes within 0.0045 dB of the Shannon limit, IEEE Communications Letters, Feb. 2001, pp. 58-60, vol. 5, No. 2.
Richardson, T., Error floors of LDPC codes, Proceedings of the annual Allerton conference on communication control and computing, Oct. 2003, pp. 1426-1435, vol. 41, No. 3.
Vontobel, P. O., et al., Graph-Cover Decoding and Finite-Length Analysis of Message-Passing Iterative Decoding of LDPC Codes, IEEE Transactions on Information Theory, Dec. 2005.
MacKay, D. J. C., et al., Weaknesses of Margulis and Ramanujan-Margulis Low-Density Parity-Check Codes, Electronic Notes in Theoretical Computer Science, Oct. 2003, pp, 97-104, vol. 74.
Bahl, L. R., et al., Optimal decoding of linear codes for minimizing symbol error rate, IEEE Transactions on Information Theory, Mar. 1974, pp. 284-287, vol. 20, No. 2.
Han, Y., et al., Low-floor decoders for LDPC codes, IEEE Transactions on Communications, Jun. 2009, pp. 1663-1673, vol. 57, No. 6.
Kang, J., et al., An Iterative Decoding Algorithm with Backtracking to Lower the Error-Floors of LDPC Codes, IEEE Transactions on Communications, Jan. 2011, pp. 64-73, vol. 59, No. 1.
Chen, X., et al., Hardware Implementation of a Backtracking-Based Reconfigurable Decoder for Lowering the Error Floor of Quasi-Cyclic LDPC Codes, IEEE Transactions on Circuitsand Systems I: Regular Papers, Dec. 2011, pp. 2931-2943, vol. 58, No. 12.

Jin, H., et al., Irregular Repeat Accumulate Codes, Proceedings of the 2nd International Symposium on Turbo codes and related topics, 2000, pp. 1-8.
Fossorier, M. P. C., et al., Reduced complexity iterative decoding of low-density parity check codes based on belief propagation, IEEE Transactions on Communications, May 1999, pp. 673-680, vol. 47, No. 5.
IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications, IEEE Std 802.11, 1997.
IEEE Standard for Information Technology—Telecommunications and Information Exchange Between Systems—Local and Metropolitan Area Networks—Specific Requirements Part 3: Carrier Sense Multiple Access With Collision Detection (CSMA/CD) Access Method and Physical Layer Specifications Amendment: Media Access Control (MAC) Parameters, Physical Layers, and Management Parameters for 10 Gb/S Operation, IEEE Std 802.3an, 2006.
McGregor, A., et al., On the Hardness of Approximating Stopping and Trapping Sets, IEEE Transactions on Information Theory, Apr. 2010, pp. 1640-1650, vol. 56, No. 4.
Karimi, M., et al., Efficient algorithm for finding dominant trapping sets of irregular LDPC codes, IEEE Transactions on Information Theory, Nov. 2011, pp. 6942-6958, vol. 58, No. 11.
Landner, S., et al., Algorithmic and combinatorial analysis of trapping sets in structured LDPC codes, 2005 International Conference on Wireless Networks, Communications and Mobile Computing, 2005, pp. 630-635, vol. 1.
Milenkovic, O., et al., Asymptotic Spectra of Trapping Sets in Regular and Irregular LDPC Code Ensembles, IEEE Transactions on Information Theory, Jan. 2007, pp. 39-55, vol. 5, No. 1.
Zhang, Y., et al., Toward low LDPC-code floors: a case study, IEEE Transactions on Communications, Jun. 2009, pp. 1566-1573, vol. 57, No. 6.
Zhang, Z., et al., Lowering LDPC Error Floors by Postprocessing, IEEE 2008 Global Telecommunications Conference, Nov. 30, 2008-Dec. 4, 2008, pp. 1-6.
Zhang, Z., et al., Design of LDPC decoders for improved low error rate performance: quantization and algorithm choices, IEEE Transactions on Communications, Nov. 2009, pp. 3258-3268, vol. 57, No. 11.
Zhang, X., et al., Quantized Iterative Message Passing Decoders with Low Error Floor for LDPC Codes, IEEE Transactions on Communications, Jan. 2014, pp. 1-14, vol. 62, No. 1.
Ryan, W. E., et al., Channel Codes Classical and Modern, Oct. 2009.
Frey, B. J., et al., Signal-space characterization of iterative decoding, IEEE Transactions on Information Theory, Feb. 2001, pp. 766-781, vol. 47, No. 2.
Declercq, D., et al., Finite Alphabet Iterative Decoders—Part II: Towards Guaranteed Error Correction of LDPC Codes via Iterative Decoder Diversity, IEEE Transactions on Communications, Oct. 2013, pp. 4046-4057, vol. 61, No. 10.
Nguyen, D. V., et al. Two-Bit Bit Flipping Algorithms for LDPC Codes and Collective Error Correction, IEEE Transactions on Communications, Apr. 2014, pp. 1153-1163, vol. 62, No. 4.
Planjery, S. K., et al., Finite Alphabet Iterative Decoders—Part I: Decoding Beyond Belief Propagation on the Binary Symmetric Channel, IEEE Transactions on Communications, Oct. 2013, pp. 4033-4045, vol. 61, No. 10.
Cole, C. A., et al., A general method for finding low error rates of LDPC codes, IEEE Transactions on Information Theory, 2006.
Laendner, S., et al., The Trapping Redundancy of Linear Block Codes, IEEE Transactions on Information Theory, Jan. 2009, pp. 53-63, vol. 55, No. 1.

* cited by examiner

- After 1 iteration
v = ( 0  1  1  0  1  0  0  0  1  1 )

Syndrome check

→ Perform next iteration

LDPC DECODER, SEMICONDUCTOR MEMORY SYSTEM AND OPERATING METHOD THEREOF

The present application claims the benefit of U.S. Provisional Application 62/136,173, filed on Mar. 20, 2015, which claims priority of Korean Patent Application No. 10-2016-0031601, filed on Mar. 16, 2016. The disclosure of each of the foregoing applications is incorporated herein by reference in its entirety.

BACKGROUND

1. Field

Various exemplary embodiments of the present invention relate to a LDPC decoder, a semiconductor memory system and an operating method thereof.

2. Description of the Related Art

In general, semiconductor memory devices are classified into volatile memory devices, such as Dynamic Random Access Memory (DRAM) and Static RAM (SRAM), and non-volatile memory devices, such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.

Volatile memory devices lose their stored data when their power supplies are interrupted, whereas non-volatile memory device retain their stored data even when their power supplies are interrupted. Non-volatile flash memory devices are widely used as storage mediums in computer systems because of their high program speed, low power consumption and large data storage capacity.

In non-volatile memory devices, especially in flash memory devices, the data state of each memory cell depends on the number of bits that the memory cell can program. A memory cell storing 1-bit data per cell is called a single-bit cell or a single-level cell (SLC). A memory cell storing 2-bit data per cell is called a multi-bit cell, a multi-level cell (MLC) or a multi-state cell. And a memory cell storing 3-bit data per cell is called a triple-level cell (TLC). The MLC and TLC are advantageous for high integration. However, as the number of bits programmed in each memory cell increases, the reliability decreases and the read failure rate increases.

For example, when k bits are to be programmed in a memory cell, one of $2^k$ threshold voltages is formed in the memory cell. Due to minute differences between the electrical characteristics of memory cells, the threshold voltages of memory cells programmed for the same data form threshold voltage distribution. Threshold voltage distributions correspond to $2^k$ data values corresponding to k-bit information respectively.

However, a voltage window available for threshold voltage distributions is finite. Therefore, as the value k increases the distance between the threshold voltage distributions decreases and the neighboring threshold voltage distributions overlap. As the neighboring threshold voltage distributions overlap, read data may include error bits.

FIG. 1 is a threshold voltage distribution schematically illustrating program and erase states of a 3-bit TLC non-volatile memory device.

FIG. 2 is a threshold voltage distribution schematically illustrating program and erase states due to characteristic deterioration of the 3-bit TLC non-volatile memory device.

In a TLC non-volatile memory device, e.g., a TLC flash memory device capable of storing 3-bit data (i.e., k=3) in a single memory cell, the memory cell may have one of $2^3$, i.e., 8 threshold voltage distributions.

Threshold voltages of memory cells programmed for the same data form the threshold voltage distribution due to characteristic differences between memory cells. In the 3-bit TLC non-volatile memory device, as illustrated in FIG. 1, threshold voltage distributions are formed in correspondence with the data states including 7 program states 'P1' to 'P7' and an erase state 'E'. FIG. 1 shows an ideal case in which threshold voltage distributions do not overlap and have sufficient read voltage margins therebetween.

Referring to the flash memory example of FIG. 2, the memory cell may experience charge loss in which electrons trapped at a floating gate or tunnel oxide film are discharged over time. Such charge loss may accelerate when the tunnel oxide film deteriorates by iterative program and erase operations. Charge loss results in a decrease in the threshold voltages of memory cells. For example, as illustrated in FIG. 2, the threshold voltage distribution may be shifted left due to charge loss.

Further, program disturbance, erase disturbance and/or back pattern dependency also cause increases in threshold voltages. As characteristics of memory cells deteriorate, neighbouring threshold voltage distributions may overlap, as illustrated in FIG. 2.

Once neighbouring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap a memory cell that has the third program state 'P3' may be erroneously determined to have the second program state 'P2'. In short, when the neighbouring threshold voltage distributions overlap as illustrated in FIG. 2, read data may include a significant number of errors.

What is therefore required is a scheme for precisely reading data stored in memory cells of a semiconductor memory device.

SUMMARY

Various embodiments of the present invention are directed to a LDPC decoder, a semiconductor memory system and an operating method thereof capable of precisely reading data stored in memory cells of a semiconductor memory device.

In accordance with an embodiment of the present invention, an operation method of a low density parity check (LDPC) decoder may include: a first step of performing an initial update operation to variable nodes by updating a codeword to the variable nodes; a second step of performing a decoding operation to a codeword based on an original parity check matrix; a third step of generating, when a number of unsatisfied syndrome checks (USCs) does not decrease anymore despite a threshold iteration numbers of the decoding operation, a modified parity check matrix by changing data of rows of the original parity check matrix corresponding to check nodes, which are selected among a plurality of check nodes of (2*t)-th level in a (2*t)-level tree structure having as root nodes USC nodes corresponding to the USCs, with dummy data; a fourth step of performing a node update operation including check node update and variable node update based on the modified parity check matrix; a fifth step of performing a predetermined number of iterations, each of which include the second to fourth steps, until the decoding operation succeeds.

Preferably, the third step may generate the modified parity check matrix by randomly selecting a predetermined number of check nodes among the plurality of check nodes of (2*t)-th level, which are linked to each of the variable nodes of a (2*t−1)-th level through paths of edges in the (2*t)-level tree structure.

Preferably, third step may generate the modified parity check matrix by randomly selecting one or more check nodes among the plurality of check nodes of (2*t)-th level, which are linked to each of the variable nodes of a (2*t−1)-th level through paths of edges in the (2*t-level tree structure, according to a predetermined selection probability.

Preferably, the codeword may be a hard decision data.

Preferably, the codeword may be a soft decision data.

Preferably, the second step may determine the decoding operation as successful when a vector generated as a result of a syndrome check of the decoding operation does not include the USCs.

In accordance with an embodiment of the present invention, a low density parity check (LDP) decoder may include: a first means for performing an initial update operation to variable nodes by updating a codeword to the variable nodes, and performing a decoding operation to a codeword based on an original parity check matrix; and a second means for generating, when a number of unsatisfied syndrome checks (USCs) does not decrease anymore despite a threshold iteration numbers of the decoding operation, a modified parity check matrix by changing data of rows of the original parity check matrix corresponding to check nodes, which are selected among a plurality of check nodes of (2*t)-th level in a (2*t)-level tree structure having as root nodes USC nodes corresponding to the USCs, with dummy data, wherein the first means performs a predetermined number of iterations, each of which includes the decoding operation and a node update operation including a check node update and a variable node update based on the modified parity check matrix until the decoding operation succeeds.

Preferably, the second means may generate the modified parity check matrix by randomly selecting a predetermined number of check nodes among the plurality of check nodes of (2*t)-th level, which are linked to each of the variable nodes of a (2*t−1)-th level through paths of edges in the (2*t-level tree structure.

Preferably, the second means may generate the modified parity check matrix by randomly selecting one or more check nodes among the plurality of check nodes of (2*t)-th level, which are linked to each of the variable nodes of a (2*t−1)-th level through paths of edges in the (2*t-level tree structure, according to a predetermined selection probability.

Preferably, the codeword may be a hard decision data.

Preferably, the codeword may be a soft decision data.

Preferably, the first means may determine the decoding operation as successful when a vector generated as a result of a syndrome check of the decoding operation does not include the USCs.

In accordance with an embodiment of the present invention, a semiconductor memory system may include: a semiconductor memory device; and a low density parity check (LDPC) decoder, wherein the LDPC decoder includes: a first means for performing an initial update operation to variable nodes by updating a codeword to the variable nodes, and performing a decoding operation to a codeword based on an original parity check matrix; and a second means for generating, when a number of unsatisfied syndrome checks (USCs) does not decrease anymore despite a threshold iteration numbers of the decoding operation, a modified parity check matrix by changing data of rows of the original parity check matrix corresponding to check nodes, which are selected among a plurality of check nodes of (2*-t)-th level in a (2*t-level tree structure having as root nodes USC nodes corresponding to the USCs, with dummy data, and wherein the first means performs a predetermined number of iterations each of which includes the decoding operation and a node update operation including a check node update and a variable node update based on the modified parity check matrix until the decoding operation succeeds.

Preferably, the second means may generate the modified parity check matrix by randomly selecting a predetermined number of check nodes among the plurality of check nodes of (2*t)-th level, which are linked to each of the variable nodes of a (2*t−1)-th level through paths of edges in the (2*t)-level tree structure.

Preferably, the second means may generate the modified parity check matrix by randomly selecting one or more check nodes among the plurality of check nodes of (2*t)-th level, which are linked to each of the variable nodes of a (2*t−1)-th level through paths of edges in the (2*t)-level tree structure, according to a predetermined selection probability.

Preferably, the codeword may be a hard decision data.

Preferably, the codeword may be a soft decision data.

Preferably, the first means may determine the decoding operation as successful when a vector generated as a result of a syndrome check of the decoding operation does not include the USCs.

In accordance with various embodiments of the present invention, data stored in memory cells of a semiconductor memory device may be precisely read.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The scope of the present invention will be understood through the claims of the present invention.

Figure 1:
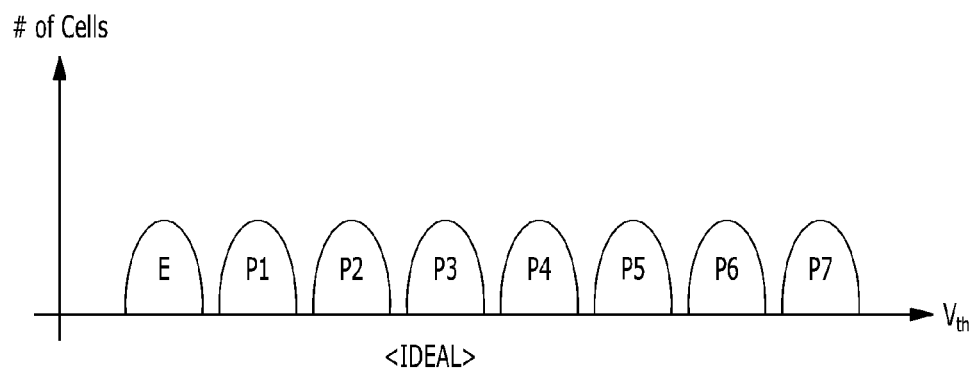
FIG. 1 is a threshold voltage distribution schematically illustrating program and erase states of a 3-bit TLC non-volatile memory device.
Figure 2:
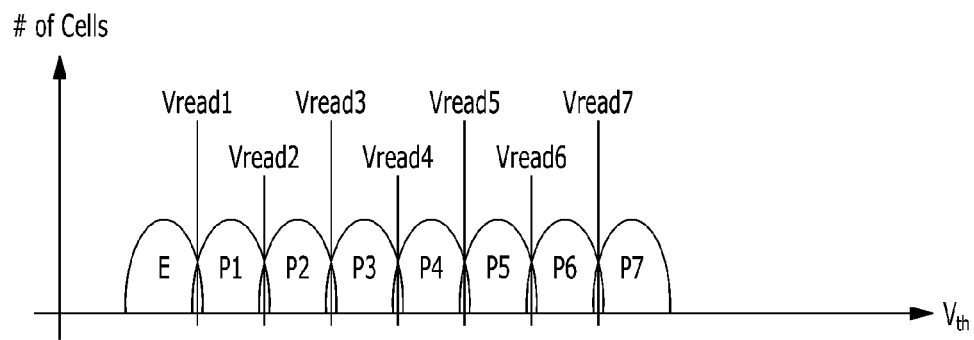
FIG. 2 is a threshold voltage distribution schematically illustrating program and erase states due to characteristic deterioration of a 3-bit MLC non-volatile memory device.
Figure 3:
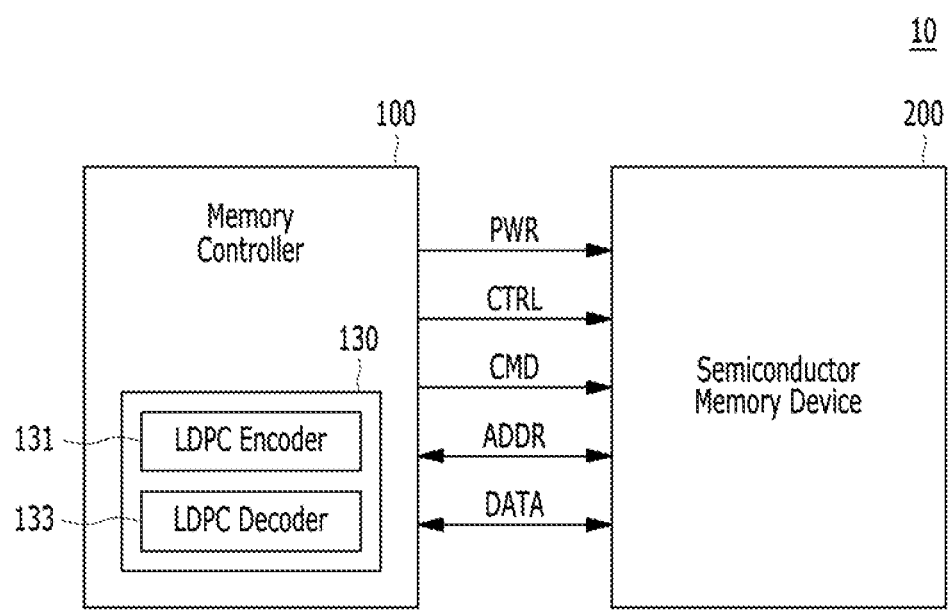
FIG. 3 is a block diagram schematically illustrating semiconductor memory system in accordance with an embodiment of the present invention.

FIG. 3 is a block diagram schematically illustrating semiconductor memory system 10 in accordance with an embodiment of the present invention.

Figure 4A:
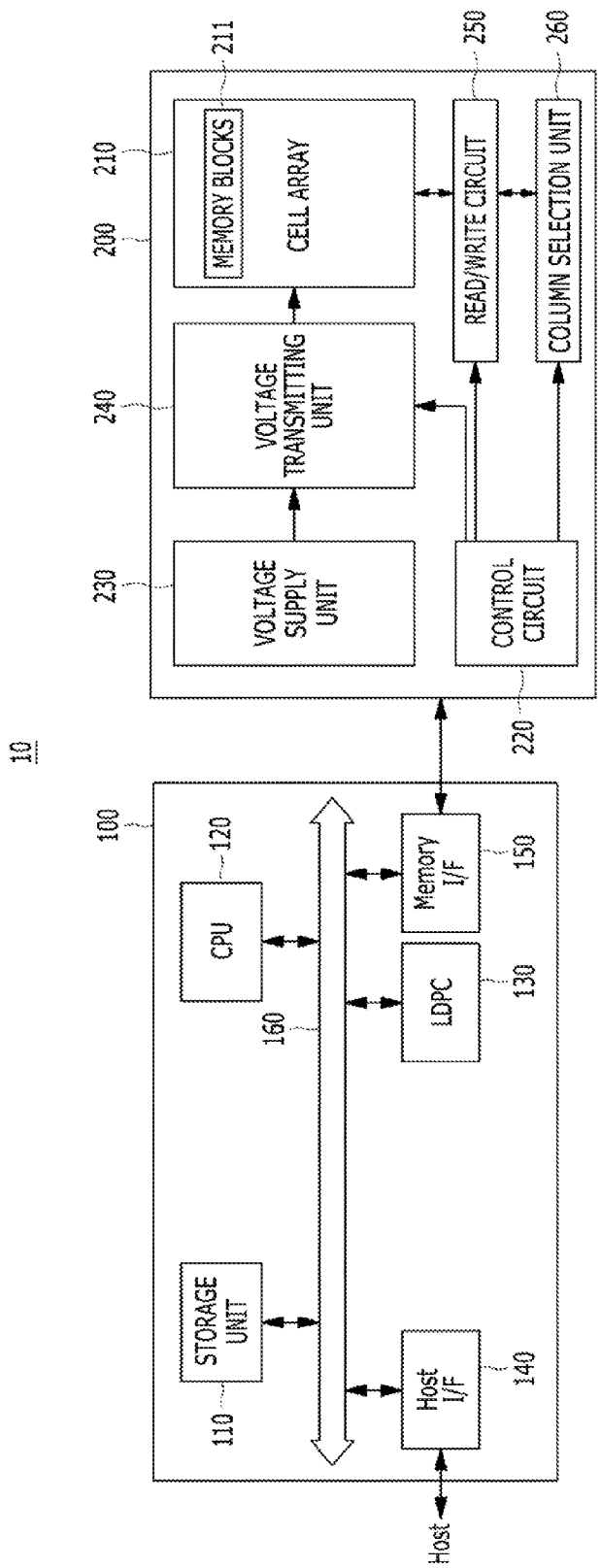
FIG. 4A is a block diagram illustrating a semiconductor memory system shown in FIG. 3.

FIG. 4A is a block diagram illustrating the semiconductor memory system 10 shown in FIG. 3.

Figure 4B:
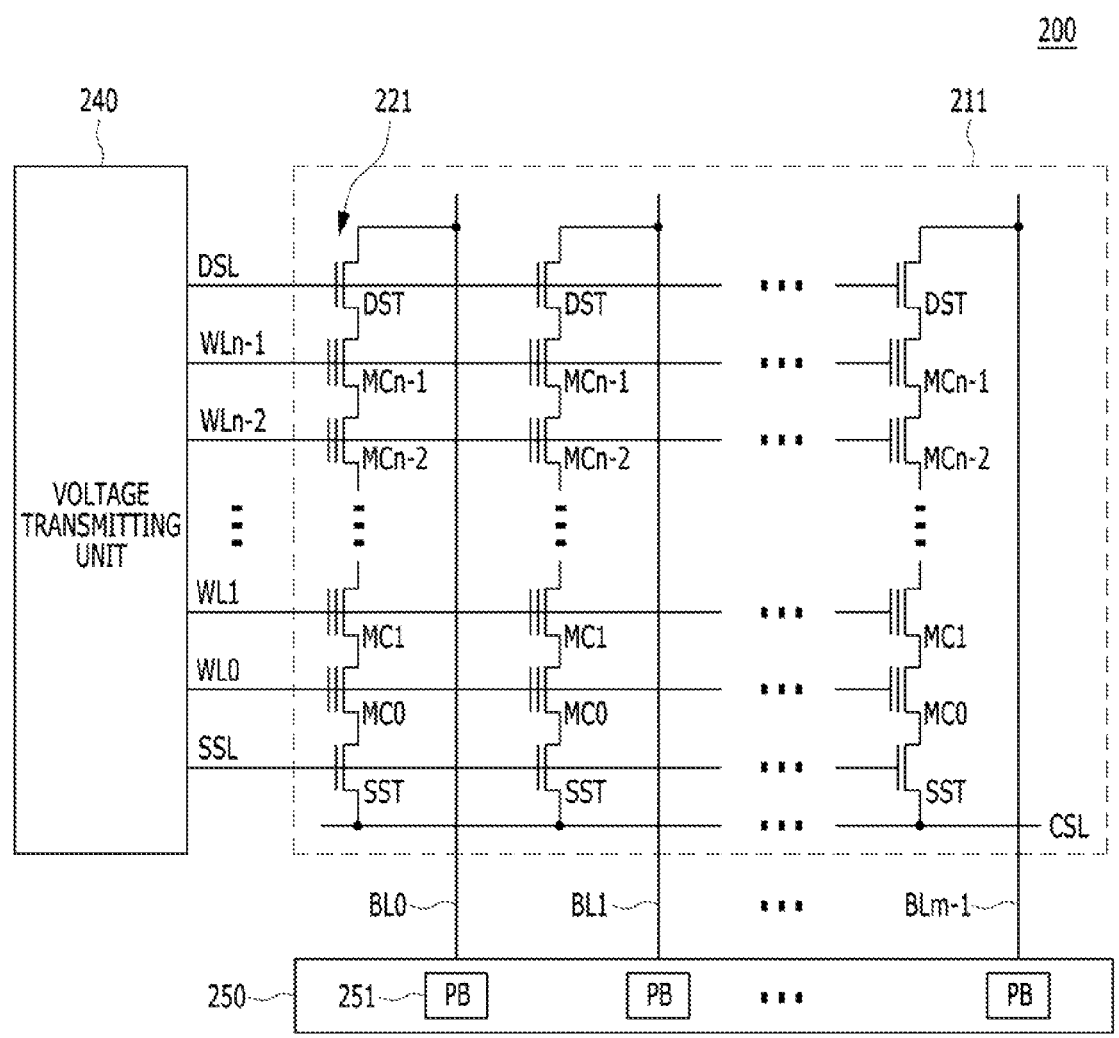
FIG. 4B is a circuit diagram illustrating a memory block shown in FIG. 4A.

FIG. 4B is a circuit diagram illustrating memory block 211 shown in FIG. 4A.

Figure 5:
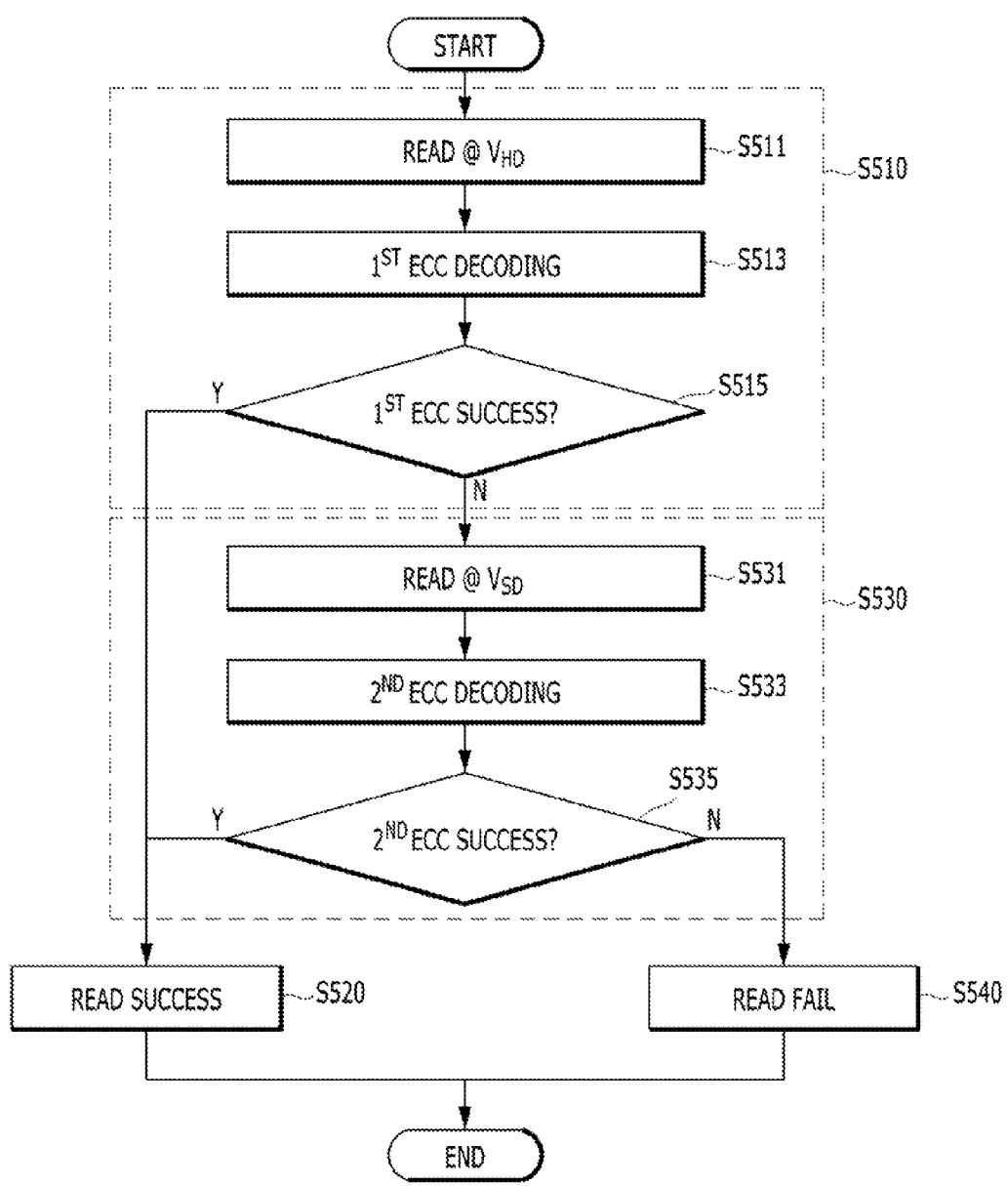
FIG. 5 is a flowchart illustrating an operation of a memory controller shown in FIG. 4A.

FIG. 5 is a flowchart illustrating the operation of a memory controller 100 included in the semiconductor memory system 10.

Referring to FIGS. 3 to 5 the semiconductor memory system 10 may include a semiconductor memory device 200 and the memory controller 100.

The semiconductor memory device 200 may perform one or more, of erase, program, and read operations under the control of the memory controller 100. The semiconductor memory device 200 may receive a command CMD, an address ADDR and data DATA through input/output lines. The semiconductor memory device 200 may receive power PAIR through a power line and a control signal CTRL through a control line. The control signal may include a command latch enable (CLE) signal, an address latch enable (ALE) signal, a chip enable (CE) signal, a write enable (WE) signal, a read enable (RE) signal and so on.

The memory controller 100 may control overall operations of the semiconductor memory device 200. The memory controller 100 may include a LDPC unit 130 for correcting error bits. The LDPC unit 130 may include a LDPC encoder 131 and a LDPC decoder 133.

The LDPC encoder 131 may perform error correction encoding on data to be programmed into the semiconductor memory device 200 to output data to which parity bits are added. The parity bits may be stored in the semiconductor memory device 200.

The LDPC decoder 133 may perform error correction decoding on data read from the semiconductor memory device 200. The LDPC decoder 133 may determine whether the error correction decoding is successful, and may output an instruction signal based on the determination result. The LDPC decoder 133 may correct error bits of data using the parity bits generated by the LDPC encoding operation.

When the number of error bits exceeds error correction capacity of the LDPC unit 130, the LDPC unit 130 may not correct the error bits. In this case, the LDPC unit 130 may generate an error correction fail signal.

The LDPC unit 130 may correct an error through a low-density parity-check (LDPC) code. The LDPC unit 130 may include all circuits, systems, or devices for error correction. The LDPC code may be a binary LDPC code or a non-binary LDPC code.

In accordance with an embodiment of the present invention, the LDPC unit 130 may perform an error bit correcting operation using hard decision read data and soft decision read data.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid state drive may include a storage device for storing data in a semiconductor memory. When the semiconductor memory system 10 is used in an SSD, operation speed of a host (not shown) coupled to the semiconductor memory system 10 may be remarkably improved.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro) a secure digital (SD) card, a mini secure digital (miniSD) card, a micro secure digital (microSD) card, a secure digital high capacity (SDHC), and a universal flash storage (UFS).

For another example, the semiconductor memory system 10 may be provided as one of various elements comprising an electronic device such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television a smart television a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or elements devices of a computing system.

Referring to FIG. 4A, the memory controller 100 may include a storage unit 110, a CPU 120, the LDPC unit 130, a host interface 140, a memory interface 150 and a system bus 160. The storage unit 110 may operate as a working memory of the CPU 120.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The LDPC unit 130 may detect and correct errors included in the data read from the semiconductor memory device 200. The memory interface 150 may interface with the semiconductor memory device 200. The LDPC encoder 131 and the LDPC decoder 133 may be implemented as different and independent components even though FIG. 4A exemplarily shows the LDPC unit 130 including both of the LDPC encoder 131 and the LDPC decoder 133. The CPU 120 may perform various control operations.

In accordance with an exemplary embodiment of the present invention, during the program operation, the LDPC unit 130 may perform a LDPC encoding to an original data which is to be programmed to the semiconductor memory device 200. In such case, during the read operation, the LDPC unit 130 may perform a LDPC decoding to the LDPC-encoded data or a codeword, which is stored in the semiconductor memory device 200.

The LDPC unit 130 may restore the original data, which is data before the LDPC encoding operation of the LDPC unit 130 during the program operation, by performing the LDPC decoding operation to the LDPC-encoded data or the codeword stored in the semiconductor memory device 200.

As discussed with reference to FIG. 5, the read operation to the data stored in the semiconductor memory device 200 may include a hard decision read operation of step S511 and a soft hard decision read operation of step S531. During the hard decision read operation, data may be read from the semiconductor memory device 200 according to a hard decision read voltage $V_{HD}$. During the soft decision read operation, data may be read from the semiconductor memory device 200 according to soft decision read voltages $V_{SD}$, which have different voltages than the hard decision read voltage $V_{HD}$. For example, an additional read operation according to the soft decision read voltages $V_{SD}$ may be performed to the memory cell, which is read according to the hard decision read voltage $V_{HD}$.

The LDPC-encoded data or the codeword, which is stored in the semiconductor memory device 200 and is read through the hard decision read operation, may be decoded back to the original data by the LDPC unit 130.

The soft decision read operation is an operation of generating the LLR, which provides the reliability of the hard decision read data read through the hard decision read operation, according to the soft decision read voltages $V_{SD}$ rather than just the read operation to data stored in the semiconductor memory device 200.

The LDPC unit 130 may perform the LDPC decoding operation to the LLR. The LDPC unit 130 may detect and correct the error of the LDPC-encoded data or the codeword read from the semiconductor memory device 200 through the LLR.

The semiconductor memory device 200 may include a memory cell array 210, a control circuit 220, a voltage supply unit 230, a voltage transmitting unit 240, a read/write circuit 250, and a column selection unit 260.

The memory cell array 210 may include a plurality of memory blocks 211. User data may be stored in the memory block 211.

Referring to FIG. 4B, the memory block 211 may include a plurality of cell strings 221 coupled to bit lines BL0 to BLm−1, respectively. The cell string 221 of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

FIG. 4B exemplarily illustrates a memory block 211 comprising a NAND-type flash memory cell. However, the memory block 211 of the semiconductor memory device 200 is not limited to being NAND flash memory, but may comprise NOR-type flash memory, hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operations related to program, erase, and read operations of the semiconductor memory device 200.

The voltage supply unit 230 may provide word line voltages, for example, a program voltage, a read voltage, and a pass voltage, to the respective word lines according to an operation mode, and may provide a voltage to be supplied to a bulk, for example, a well region in which the memory cells are formed. A voltage generating operation of the voltage supply circuit 230 may be performed under control of the control circuit 220.

The voltage supply unit 230 may generate a plurality of variable read voltages for generating a plurality of read data.

The voltage transmitting unit 240 may select one of the memory blocks 211 or sectors of the memory cell array 210, and may select one of the word lines of the selected memory block under the control of the control circuit 220. The voltage transmitting unit 240 may provide the word line voltage generated from the voltage supply circuit 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During the normal read operation, the column selection unit 260 may output the data read from the read/write circuit 250 to the outside, for example, to the memory controller 100, based on column address information. On the other hand, during the verification read operation, the read data may be provided to a pass/fail verification circuit (not illustrated) included in the semiconductor memory device 200, and be used for determining whether a program operation of the memory cell succeeds.

During the program operation, the read/write circuit 250 may operate as a write driver for driving the bit lines according to data to be stored in the memory cell array 210. During the program operation, the read/write circuit 250 may receive the data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

Referring to FIGS. 4A and 5, the operation of the memory controller 100 may include a hard decision decoding step S510, and may additionally include a soft decision decoding step S530. A target data of the hard and soft decision decoding steps S510 and S530, or the data stored in the semiconductor memory device 200 may be the LDPC-encoded data or the cored word, which is LDPC-encoded by the LDPC unit 130.

For example the hard decision decoding step S510 may be a step of a hard decision LDPC decoding for hard decision read data of predetermined length, which is read from a memory cell of the memory block 211 according to the hard decision read voltage $V_{HD}$. The hard decision decoding step S510 may include steps S511 to S515.

For example, the soft decision decoding step S530 may be a step of a soft decision LDPC decoding for the hard decision read data by forming soft decision read data according to soft decision read voltages $V_{SD}$ around the hard decision read voltage $V_{HD}$ when the hard decision LDPC decoding of the hard decision decoding step S510 finally fails. The soft decision decoding step S530 may include steps S531 to S535.

As described above, at step S511 of the hard decision read step, the hard decision read data may be read from the semiconductor memory device 200 according to the hard decision read voltage $V_{HD}$. The memory controller 100 may provide a read command and an address to the semiconductor memory device 200. The semiconductor memory device 200 may read the hard decision read data therefrom according to the hard decision read voltage $V_{HD}$ in response to the read command and the address. The read hard decision read data may be provided to the memory controller 100.

At step S513, the hard decision LDPC decoding as the hard decision decoding may be performed. The LDPC unit 130 may perform the hard decision LDPC decoding to the hard decision read data, which is, read from the semiconductor memory device 200 according to the hard decision read voltage $V_{HD}$ by using the error correction code.

At step S515 it may be determined whether the hard decision LDPC decoding succeeds or fails. That is, at step S515, it may be determined whether an error of the hard decision read data, to which the hard decision LDPC decoding is performed at step S513, is corrected. For example, the memory controller 100 may determine whether an error of the hard decision read data is corrected by using the hard decision read data and a parity check matrix. For example, when product result of the parity check matrix and the hard decision read data is a zero vector ('0'), it may be determined that the hard decision read data is corrected. On the other hand, when product result of the parity check matrix and the hard decision read data is not the zero vector ('0'), it may be determined that the hard decision read data is not corrected.

When it is determined that the hard decision read data is corrected as the result of determination of step S515, it may be determined at step S520 that the read operation according to hard decision read voltage $V_{HD}$ at step S511 is successful and the operation of the memory controller 100 may end. The hard decision read data, to which the hard decision LDPC decoding is performed at step S513, may be now the error-corrected data and may be provided externally or used in the memory controller 100.

When it is determined that the hard decision read data is not corrected as the result of determination of step S515, the soft decision decoding step S530 may be performed.

As described above, at step S531 of the soft decision read step, the soft decision read data may be read from the semiconductor memory device 200 according to the soft decision read voltages $V_{SD}$. For example, the additional read operation according to the soft decision read voltages $V_{SD}$ may be performed on the memory cell, to which the hard decision decoding step S510 is performed according to the hard decision read voltage $V_{HD}$. The soft decision read voltages $V_{SD}$ may be different than the hard decision read voltage $V_{HD}$.

At step S533, the soft decision LDPC decoding as the soft decision decoding may be performed. The soft decision LDPC decoding may be performed based on the soft decision read data comprising the hard decision read data, to which the hard decision LDPC decoding is performed, and data read from the memory cell according to the soft decision read voltages $V_{SD}$. The hard decision read voltage $V_{HD}$ and the soft decision read voltages $V_{SD}$ may be different.

For example, each of the memory cells MC0 to MCn−1 of the semiconductor memory device 200 may belong to one of the threshold voltage distributions including 7 program states P1 to P7 and 1 erase state E.

The hard decision read voltage $V_{HD}$ may have a voltage between 2 neighbouring states, of the plurality of states (E and P1 to P7). Each of the soft decision read voltages $V_{SD}$ may have a voltage between 2 neighbouring states of the plurality of states (E and P1 to P7), which is different from the hard decision read voltage $V_{HD}$.

The hard decision read data read from the memory cells MC0 to MCn−1 according to the hard decision read voltage $V_{HD}$ and the soft decision read data read therefrom according to the soft decision read voltages $V_{SD}$ may have different values. For example, there may be a tailed one of the memory cells MC0 to MCn−1 having the threshold voltage higher or lower than the threshold voltage distribution of the normal logic state. The hard decision read data read from the tailed memory cell according to the hard decision read voltage $V_{HD}$ and the soft decision read data read therefrom according to the soft decision read voltages $V_{SD}$ may have different values. When the additional read operation according to the soft decision read voltages $V_{SD}$ is performed as well as the read operation according to the hard decision read voltage $V_{HD}$, additional information on the threshold voltages of the memory cells MC0 to MCn−1 (i.e., additional information on the tailed memory cells) or the log likelihood ratio (LLR) providing reliability of the hard decision read data read by the hard decision read operation may be obtained.

When the additional information is obtained, the probability of the likelihood ratio whether the data of the memory cells MC0 to MCn−1 belong to the first state (i.e. '1'), or the second state (i.e. '0'), may increase. That is, the reliability of the LDPC decoding may increase. The memory controller 100 may perform the soft decision LDPC decoding based on the soft decision read data, which is read according to the hard decision read voltage $V_{HD}$ and the soft decision read voltages $V_{SD}$. The relationship between the hard decision read voltage $V_{HD}$ and the soft decision read voltages $V_{SD}$ will be disclosed with reference to FIGS. 7A and 7B.

At step S535, it may be determined whether the soft decision LDPC decoding succeeds or fails. That is, at step S535, it may be determined whether an error of the soft decision read data, to which the soft decision LDPC decoding is performed at step S533, is corrected. For example, the memory controller 100 may determine whether an error of the soft decision read data is corrected by using the soft decision read data and the parity check matrix. For example, when product result of the parity check matrix and the soft decision read data is the zero vector ('0'), it may be determined that the soft decision read data, to which the soft decision LDPC decoding is performed, is corrected. On the other hand, when product result of the parity check matrix and the soft decision read data is not the zero vector ('0'), it may be determined that the soft decision read data, to which the soft decision LDPC decoding is performed, is not corrected.

The product process of the parity check matrix and the hard decision read data during the hard decision decoding step S510 may be the same as the product process of the parity check matrix and the soft decision read data during the soft decision decoding step S530.

When it is determined that the soft decision read data is corrected as the result of determination of step S535, it may be determined at step S520 that the read operation according to soft decision read voltage $V_{SD}$ at step S531 is successful and the operation of the memory controller 100 may end. The soft decision read data, to which the soft decision LDPC decoding is performed at step S533, may be now the error-corrected data and may be provided externally or used in the memory controller 100.

When it is determined that the soft decision read data is not corrected as the result of determination of step S535, it may be determined at step S540 that the read operation of the memory controller 100 to the memory cells MC0 to MCn−1 finally fails and the operation of the memory controller 100 may end.

Figure 6A:
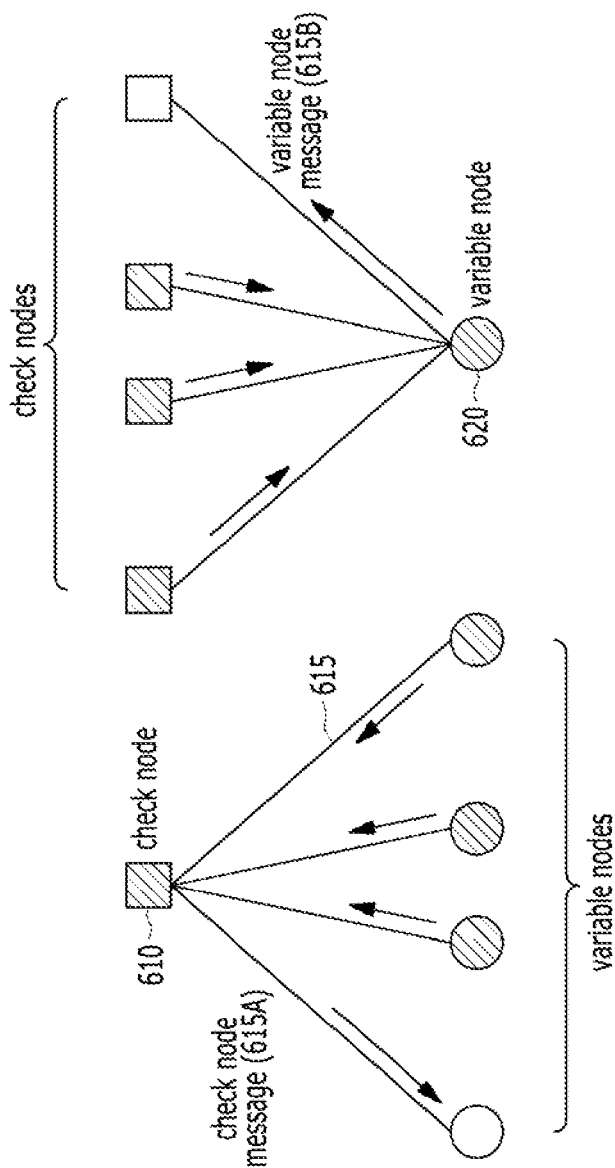
FIG. 6A is a schematic diagram illustrating LDPC decoding represented by a tanner graph.

FIG. 6A is a schematic diagram illustrating LDPC decoding represented by a tanner graph.

Figures 6B, 6C:
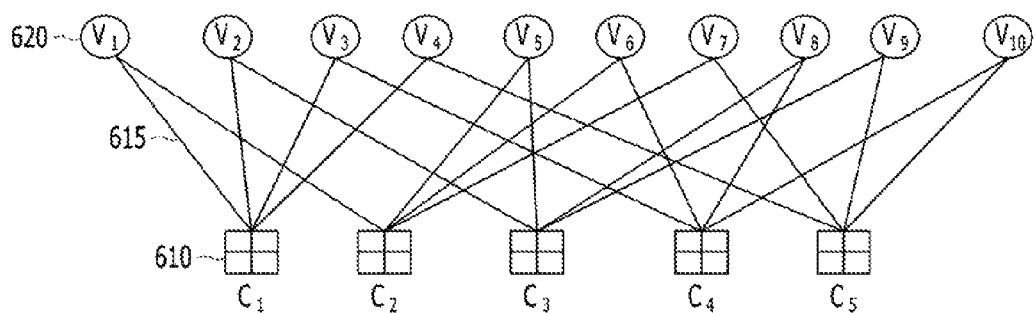
FIG. 6B is a schematic diagram illustrating an LDPC code.
FIG. 6C is a schematic diagram illustrating a syndrome check process according to LDPC decoding.

FIG. 6B is a schematic diagram illustrating an LDPC code.

FIG. 6C is a schematic diagram illustrating a syndrome check process according to the LDPC decoding.

An error correction code (ECC) is commonly used in storage systems. Various physical phenomena occurring in storage devices result in noise effects that corrupt the stored information. Error correction coding schemes can be used for protecting the stored information against the resulting errors. This is done by encoding the information before storing the information in the memory device. The encoding process transforms the information bit sequence into a codeword by adding redundancy to the information. This redundancy can then be used in order to recover the information from the possibly corrupted codeword through a decoding process.

In iterative coding schemes, the code is constructed as a concatenation of several simple constituent codes and is decoded based on an iterative decoding algorithm by exchanging information between decoders receiving the simple constituent codes. Usually, the code can be defined using a bipartite graph or a tanner graph describing interconnections between the constituent codes. In this case, decoding can be viewed as an iterative message passing over the graph edges.

The iterative codes may include the low-density parity-check (LDPC) code. The LDPC code is a linear binary block code defined by a sparse parity-check matrix H.

Referring to FIG. 6A, the LDPC code has a parity check matrix in which the number of is in each row and column is very small, and its structure can be defined by the tanner graph including check nodes 610, variable nodes 620, and edges 615 connecting the check nodes 610 to the variable nodes 620. A value delivered from the check node 610 to the variable node 620 after check node processing becomes a check node message 615A, and a value delivered from the variable node 620 to the check node 610 after variable node processing becomes a variable node message 615B.

A decoding process of the LDPC code is performed by iterative decoding based on a 'sum-product' algorithm. A decoding method can be provided based on a suboptimal message-passing algorithm such as a 'min-sum' algorithm, which is a simplified version of the sum-product algorithm.

For example, referring to FIG. 6B, the tanner graph of the LDPC code includes 5 check nodes 610 representing parity check equations of the LDPC code, 10 variable nodes 620 representing code symbols, and edges 615 representing relationships between the check nodes 610 and the variable nodes 620. The edges 615 connect each check node 610 to the variable node 620 corresponding to a code symbol included in the parity check equations represented by the check nodes 610. FIG. 6B exemplarily illustrates a regular LDPC code in which the number of variable nodes 620 coupled to each of the check nodes 610 is fixed at 4 and the number of the check nodes 200 coupled to each of the variable nodes 620 is fixed at 2. An initial value of the variable node 620 may be one of the hard decision read data and the soft decision read data.

FIG. 6C shows a parity check matrix H corresponding to the tanner graph. The parity check matrix H is similar to the graphic expression of the parity check equations. The parity check matrix H has the same number of 1s in each column and each row. That is, each column of the parity check matrix H has two 1s corresponding to the connections between each of the variable nodes 620 and the check nodes 610, and each row has four 1s corresponding to the connections between each of the check nodes 610 and the variable nodes 620.

A process of decoding the LDPC code is performed by iterating a process of exchanging messages, which are generated and updated in each node, between the variable nodes 620 and the check nodes 610 in the tanner graph. In this case, each node updates the messages based on the sum-product algorithm or a similar suboptimal algorithm.

For example, the LDPC decoding on the hard decision read data may comprise a plurality of iterations, each of which includes update of the check nodes, update of the variable nodes, and a syndrome check after an initial update of the variable nodes. After the single iteration, when the result of the syndrome check satisfies a predetermined condition, the LDPC decoding may end. When the result of the syndrome check does not satisfy the predetermined condition, an additional single iteration may be performed.

The additional iteration may include a check node update, a variable node update and the syndrome check. The number of iterations may be limited to a maximum iteration count. When the result of the syndrome check does not satisfy the predetermined condition until the number of iterations reaches the maximum iteration count, the LDPC decoding on the codeword may be determined to have failed in LDPC decoding.

Referring to FIG. 6C, the syndrome check is a process of identifying whether the product result "$Hv^t$" of the parity check matrix H and a vector "v" which is obtained by the update of the variable nodes, satisfies the predetermined condition. When the product result "$Hv^t$" becomes the zero vector, the product result "$Hv^t$" may be evaluated to satisfy the predetermined condition.

FIG. 6C shows the syndrome check process. FIG. 6C exemplarily shows a non-zero vector "01000" as the product result "$Hv^t$", and thus FIG. 6C shows that the syndrome check does not satisfy the predetermined condition and another single iteration should be performed.

Considering the non-zero vector "01000" as the product result "$Hv^t$", the number of non-zero vector elements or elements, which do not meet the zero vector condition, is 1. In the description, the elements that do not meet the zero vector condition of the syndrome check for the product result "$Hv^t$" in the single iteration is defined as unsatisfied syndrome check (USC). FIG. 6C shows the result of the syndrome check where the number of the USC is 1.

Figure 7A:
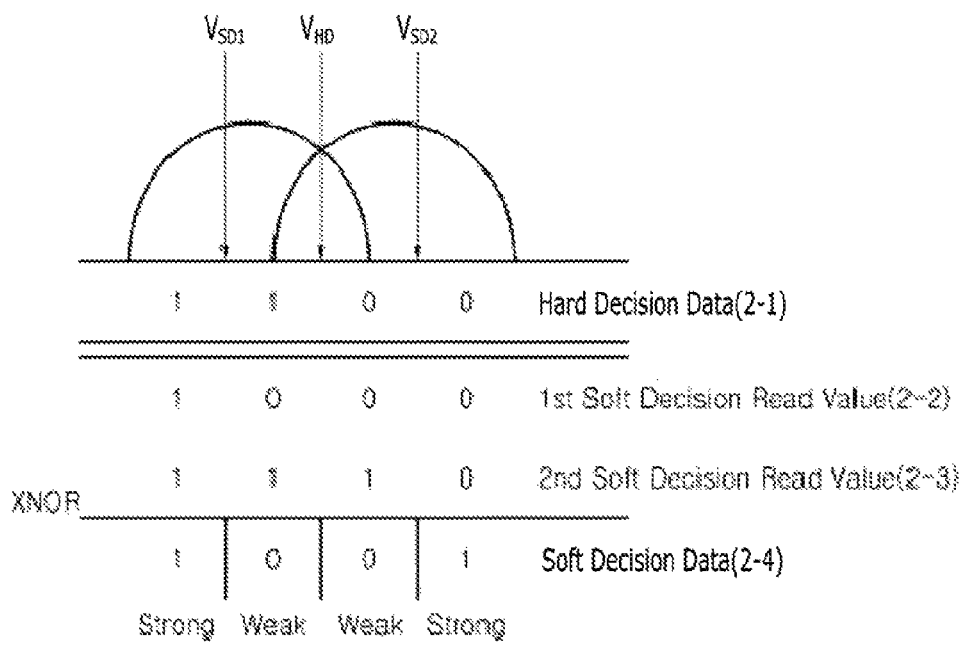
FIG. 7A is a schematic diagram illustrating a 2-bit soft decision read operation as a soft decision read operation shown in FIG. 5.
Figure 7B:
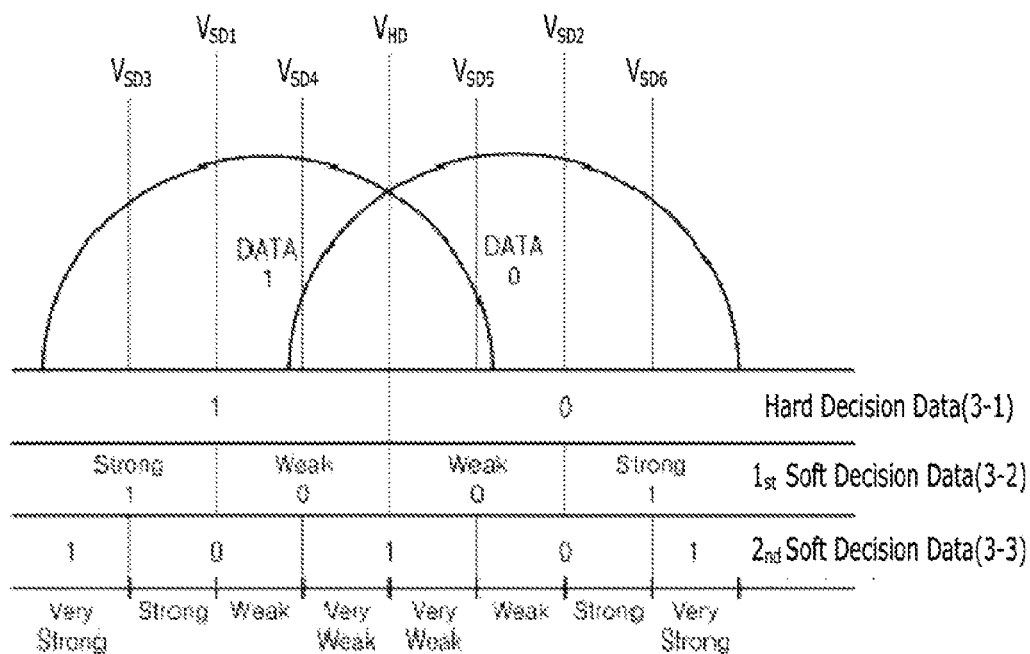
FIG. 7B is a schematic diagram illustrating a 3-bit soft decision read operation as a soft decision read operation shown in FIG. 5.

FIGS. 7A and 7B are schematic diagrams illustrating the soft decision read operation shown in FIG. 5, particularly 2-bit and 3-bit soft decision read operations, respectively.

Referring to FIG. 7A, during the hard decision decoding operation of step S510 described with reference to FIG. 5, the hard decision read data 2-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ and $V_{SD2}$, which have different voltages from the hard decision read voltage $V_{HD}$, are applied to the memory cell.

Referring to FIG. 7A, during the 2-bit soft decision read operation, a first soft decision read value 2-2 may be "1000" according to the on/off status of a memory cell when the first soft decision read voltage $V_{SD1}$ is applied to the memory cell. In a similar way, a second soft decision read value 2-3 may be '1110' according to the on/off status of the memory cell when the second soft decision read voltages $V_{SD2}$ is applied to the memory cell.

For example, the LDPC unit 130 may generate a soft decision read data 2-4 or the LLR through the XNOR operation to the first and second soft decision read values 2-2 and 2-3. The LLR 2-4 may show reliability of the hard decision read data 2-1.

For example, the value '1' of the soft decision read data 2-4 may show a "strong" probability of the first and second statuses (the logic values of '1' and '0') of the hard decision read data 2-1. On the other hand, the value '0' of the soft decision read data 2-4 may show a "weak" probability of the first and second statuses of the hard decision read data 2-1.

Referring to FIG. 7B, during the hard decision decoding operation of step S510 described with reference to FIG. 5, the hard decision read data 3-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ to $V_{SD6}$, which have different voltages from the hard decision read voltage $V_{HD}$, are applied to the memory cell.

Referring to FIG. 7b, during the 3-bit soft decision read operation, first and second soft decision read values may be generated according to the on/off status of a memory cell when first and second soft decision read voltages $V_{SD1}$ and $V_{SD2}$ are applied to the memory cell, which is similar to the 2-bit soft decision read operation described with reference to FIG. 7A. The LPC unit 130 may generate a first soft decision read data 3-2 '1001' or the LLR through the XNOR operation to the first and second soft decision read values.

In a similar way, during the 3-bit soft decision read operation, third to sixth soft decision read values may be generated according to the on/off status of the memory cell when third to sixth soft decision read voltages $V_{SD3}$ to $V_{SD6}$, which have different voltages from the first and second soft decision read voltages $V_{SD1}$ and $V_{SD2}$ are applied to the memory cell, which is similar to the 2-bit soft decision read operation described with reference to FIG. 7A. The LDPC unit 130 may generate a second soft decision read data 3-3 ('10101') or the LLR through the XNOR operation to the third to sixth soft decision read values. The LLR 3-3 ('10101') may provide a weighted value to the first soft decision read data 3-2.

For example, the value '1' of the second soft decision read data 3-3 may show a "very strong" probability of the first status (the logic value of '1') of the first soft decision read data 3-2. On the other hand, the value '0' of the second soft decision read data 3-3 may show a "strong" probability of the first status of the first soft decision read data 3-2.

In a similar way, the value '1' of the second soft decision read data 3-3 may show a "very weak" probability of the second status (the logic value of '0') of the first soft decision read data 3-2. On the other hand, the value '0' of the second soft decision read data 3-3 may show a "weak" probability of the second status of the first soft decision read data 3-2. The LLR 3-3 may provide a better reliability to the hard decision read data 3-1, which is similar to the 2-bit soft decision read operation described with reference to FIG. 7A.

Figure 8A:
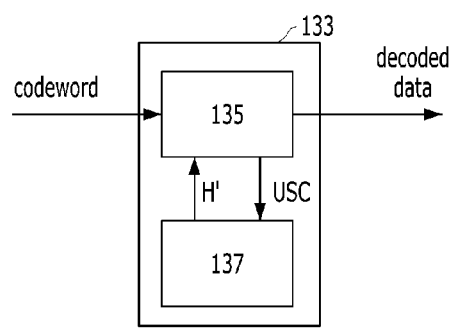
FIG. 8A is a schematic diagram illustrating a LDPC decoder in accordance with an embodiment of the present invention.

FIG. 8A is a schematic diagram illustrating the LDPC decoder 133 in accordance with an embodiment of the present invention.

Referring to FIG. 8A, the LDPC decoder 133 may include a LDPC decoding unit 135 and a parity check matrix modification unit 137.

The LDPC decoding unit 135 may output a decoded data or an original data by performing the LDPC decoding operation to the encoded data or the codeword programmed in the semiconductor memory device 200 in one of a main LDPC decoding mode or a sub LDPC decoding mode.

In the main LDPC decoding mode, the LDPC decoding unit 135 may perform the LDPC decoding operation to the encoded data or the codeword programmed in the semiconductor memory device 200, as described with reference to FIGS. 5 to 6C. In detail, the LDPC decoding on the hard decision read data comprising the plurality of iterations, each of which includes the update of the check nodes, the update of the variable nodes, and the syndrome check after the initial update of the variable nodes 620 may be performed based on an original parity check matrix H until the LDPC decoding succeeds. Here, the update of the check nodes and the variable nodes based on the original parity check matrix H may be an update between the check nodes 610 and the variable nodes 620 linked to each other according to the original parity check matrix H. The original parity check matrix H may include a regular parity check matrix and an irregular parity check matrix H.

When the number of USCs does not decrease anymore despite several, iteration numbers of the LDPC decoding, the LDPC decoding unit 135 may determine the original parity check matrix H to have a trapping set of the variable nodes and the check nodes and stop the main LDPC decoding mode.

When the original parity check matrix H is determined to have the trapping set and the main LDPC decoding mode stops, the LDPC decoding unit 135 may provide the information of the USC to the parity check matrix modification unit 137.

Upon stop of the main LDPC decoding mode of the LDPC decoding unit 135, the parity check matrix modification unit 137 may generate a modified parity check matrix H' by changing data of partial rows of the original parity check matrix H with a dummy data (i.e., "0").

In order to generate the modified parity check matrix H', the parity check matrix modification unit 137 may select a predetermined number of check nodes among a plurality of check nodes of (2*t)-th level in a (2*t)-level tree structure having a USC node, which correspond to the USC, as a root node, and may change the data of several rows of the original parity check matrix H corresponding to the selected check nodes with the dummy data ("0").

The parity check matrix H may be represented by the tanner graph or the bipartite graph. The tree structure may be a data structure in which paths of the edges 615 are deployed with reference to an arbitrary check node 610 or an arbitrary variable node 620 in the parity check matrix H (i.e., the tanner graph or the bipartite graph) as the root node. As described above, the edges 615 are the message paths between the nodes, the value delivered from the check node 610 to the variable node 620 is the check node message 615A, and the value delivered from the variable node 620 to the check node 610 is the variable node message 615B. The check nodes 610 and the variable nodes 620 may be updated on the basis of the check node message 615A and the variable node message 615B.

Figure 8B:
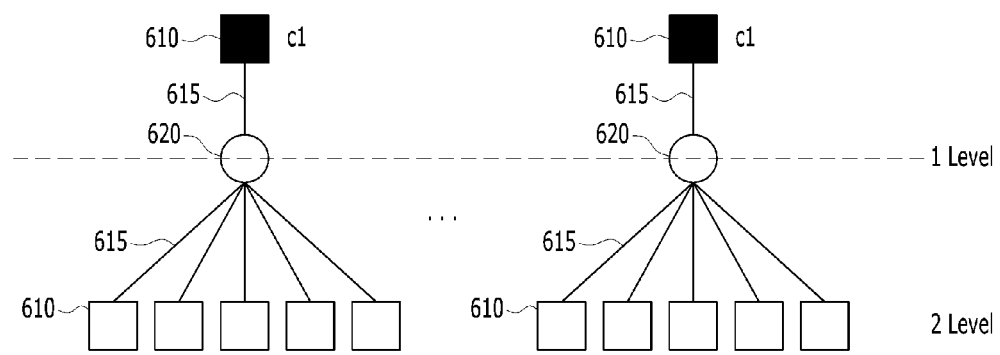
FIG. 8B is a schematic diagram illustrating 2-level tree structure having respective USC nodes as respective root nodes.

FIG. 8B is a schematic diagram illustrating 2-level tree structures having respective USC nodes as respective root nodes.

Referring to FIG. 8B, in each of the tree structures having the respective USC nodes C1 to CN corresponding to the USC as the respective root nodes, the variable nodes 620 respectively linked to the root nodes C1 to CN through the edges 615 may be located at a first level and the check nodes 610 respectively linked to the variable nodes 620 of the first level through the edges 615 may be located at a second level. In accordance with an embodiment of the present invention, When locating the check nodes 610 and the variable nodes 620 linked through the paths of the edges 615 at each level, the check nodes 610 may be located at a (2*t)-th level in the tree structure of (2*t-levels. The value "t" may be determined as a separation value of the trapping set of the LDPC code when information of the trapping set is known, and may be determined as a value of "1" when information of the trapping set is not known. In general, the information of incorrect variable nodes and the trapping set of the parity check matrix H may not be known a priori. Here, the incorrect variable nodes are the ones that are not corrected despite the iterative LDPC decoding, and the trapping set is the one having the incorrect variable nodes and the check nodes linked to the incorrect variable nodes through the paths of edges 615. Assuming that a tree structure has the incorrect variable node of the trapping set as the root node, the tree structure is "s-separated" when one or more having a single edge among the check nodes located at the first level do not have the incorrect variable node as a descendant node to a depth of a "s"-th level. It is "s" that is the separation value of the tree structure.

In accordance with an embodiment of the present invention, the parity check matrix modification unit 137 may arbitrarily select a predetermined number "$d_f$" of ones among the check nodes 610 of the (2*t)-th level, which are linked to each of variable nodes 620 of a (2*t−1)-th level through the paths of the edges 615, and may change the data of the rows of the original parity check matrix H corresponding to the selected check nodes with the dummy data ("0") for the generation of the modified parity check matrix H'.

The predetermined number "$d_f$" may satisfy following equation 1.

$$1 \leq d_f < d_v - 1 \qquad \text{[Equation 1]}$$

In equation 1 denotation "$d_v$" represents a number of the edges 615 linked to the variable nodes 620 of the (2*t−1)-level.

Figure 8C:
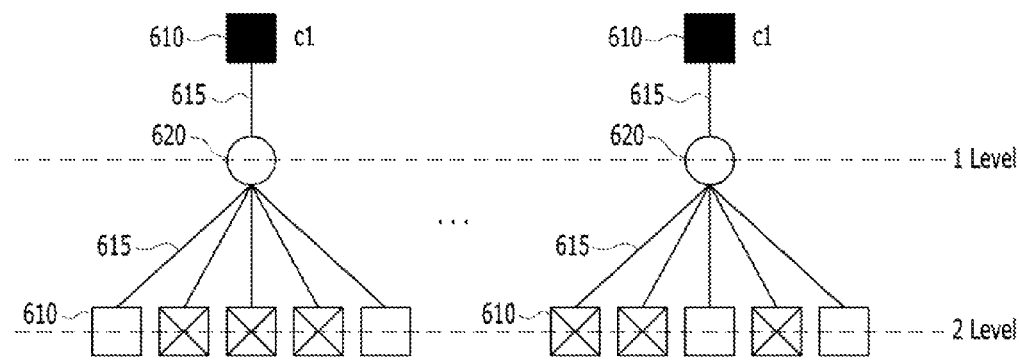
FIG. 8C is a schematic diagram illustrating selection operation of check nodes in accordance with an embodiment of the present invention.

FIG. 8C is a schematic diagram illustrating selection operation of check nodes 610 in accordance with an embodiment of the present invention.

For example, referring to FIGS. 8B and 8C of the 2-level tree structure (i.e., t=1, 2t=2 and 2t−1=1) having the USC nodes C1 to CN as the root nodes, the parity check matrix modification unit 137 may arbitrarily select 3 ("$d_f$"=3) among the check nodes 610 of a second level, which are linked to each of variable nodes 620 of a first level through the paths of the edges 615, and may change the data of the rows of the original parity check matrix H corresponding to the selected check nodes with the dummy data ("0") for the generation of the modified parity check matrix H'.

In accordance with an embodiment of the present invention, the parity check matrix modification unit 137 may arbitrarily select some among the check nodes 610 of the (2*t)-th level according to a predetermined selection probability "$p_r$", and may change the data of the rows of the original parity check matrix H corresponding to the selected check nodes with the dummy data ("0") for the generation of the modified parity check matrix H'. Specifically, the parity check matrix modification unit 137 may arbitrarily select some, among the check nodes 610 of the (2*t)-th level by applying the predetermined selection probability "$p_r$" to each of the check nodes 610 of the (2*t)-th level and thus by determining whether to select a corresponding one among the check nodes 610 of the (2*t)-th level, and may change the data of the rows of the original parity check matrix H corresponding to the selected check nodes with the dummy data ("0") for the generation of the modified parity check matrix H'.

The predetermined selection probability "$p_r$" may satisfy following equation 2.

$$0 < p_r < 1 \qquad \text{[Equation 2]}$$

Figure 8D:
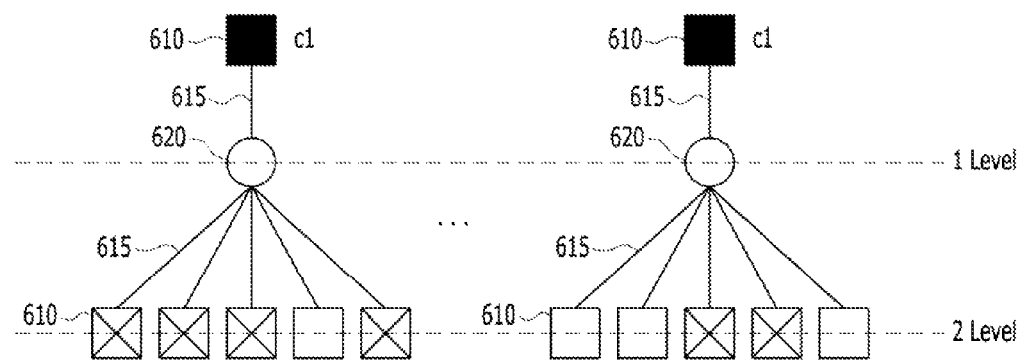
FIG. 8D is a schematic diagram illustrating selection operation of check nodes in accordance with an embodiment of the present invention.

FIG. 8D is a schematic diagram illustrating selection operation of check nodes in accordance with an embodiment of the present invention.

For example, referring to FIGS. 8B and 8D of the 2-level tree structure (i.e., t=1, 2t=2 and 2t−1=1) having the USC nodes C1 to CN as the root nodes, the parity check matrix modification unit 137 may arbitrarily select some (e.g., 3 check nodes) among the check nodes 610 of the (2*t)-th level by applying the predetermined selection probability "$p_r$" to each of the check nodes 610 of the (2*t)-th level, and may change the data of the rows of the original parity check matrix H corresponding to the selected check nodes with the dummy data ("0") for the generation of the modified parity check matrix H'. As illustrated in FIG. 8D, the parity check matrix modification unit 137 may arbitrarily select some among the check nodes 610 of the (2*t)-th level by applying the predetermined selection probability "$p_r$" to each of the check nodes 610 of the (2*t)-th level, and thus a number of selected check nodes 610 of the (2*t)-th level linked to the respective variable nodes 620 of the (2*t−1)-th level may be different.

Consequently, the modified parity check matrix H' may have the dummy data ("0") changed from the data of the rows of the original parity check matrix H corresponding to the selected check nodes. The check nodes 610 corresponding to the dummy data ("0") may not be linked to the variable nodes 520 through the paths of the edges 615 anymore, and thus the updates of the check nodes and the variable nodes in the modified parity check matrix H' may be different from those in the original parity check matrix H.

The parity check matrix modification unit 137 may generate a plurality of various modified parity check matrixes H'. The parity check matrix modification unit 137 may select the check nodes 610, and may change the data of the rows of the original parity check matrix H corresponding to the selected check nodes with the dummy data ("0") for the generation of a first modified parity check matrix H'. Also, the parity check matrix modification unit 137 may generate a plurality of various modified parity check matrixes H'. The parity check matrix modification unit 137 may re-select another check nodes 610 and may change the data of the rows of the original parity check matrix H corresponding to the re-selected check nodes with the dummy data ("0") for the generation of a second modified parity check matrix H'. In such way, the parity check matrix modification unit 137 may generate a plurality of various modified parity check matrixes H'. In this case, the selected check nodes 610 and the re-selected check nodes 610 may be different from each other and thus the first modified parity check matrix H' and the second modified parity check matrix H' may also be different from each other.

The parity check matrix modification unit 137 may provide the modified parity check matrix H' to the LDPC decoding unit 135.

Upon receiving the modified parity check matrix H', the LDPC decoding unit 135 may start the sub LDPC decoding mode.

In the sub LDPC decoding mode, the LDPC decoding unit 135 may perform the update operation to the check nodes 610 and the variable nodes 620 according to the modified parity check matrix H' the predetermined number of iterations. Here, the update of the check nodes and the variable nodes based on the modified parity check matrix H' may be an update between the check nodes 610 and the variable nodes 620 linked to each other according to the modified parity check matrix H'.

When the LDPC decoding unit 135 receives the plurality of various modified parity check matrixes H' (e.g., the first and second modified parity check matrixes H'), the LDPC, decoding unit 135 may perform the update operation to the check nodes 610 and the variable nodes 620 of each of the first and second modified parity check matrixes H'. That is, the LDPC decoding unit 135 may perform the update operation to the check nodes 610 and the variable nodes 620 according to the first modified parity check matrix H' the predetermined number of iterations, and then perform the update operation to the check nodes 610 and the variable nodes 620 according to the second modified parity check matrix H' the predetermined number of iterations.

Upon completion of the update operation to the check nodes 610 and the variable nodes 620, the LDPC decoding unit 135 may stop the sub LDPC decoding mode and resume the main LDPC decoding mode. In the resumed main LDPC decoding mode, the LDPC decoding unit 135 may perform the LDPC decoding on the encoded data or the codeword programmed in the semiconductor memory device 200, the LDPC decoding comprising the plurality of iterations, each of which includes the update of the check nodes, the update of the variable nodes, and the syndrome check based on the original parity check matrix H without the initial update of the variable nodes 620 until the LDPC decoding succeeds.

Because the LDPC decoding unit 135 may perform the update operation to the check nodes 610 and the variable nodes 620 according to the modified parity check matrix H' in the sub LDPC decoding mode the update operations to the check nodes 610 and the variable nodes 620 according to the original parity check matrix H in the main LDPC decoding modes before and after the sub LDPC decoding mode may progress in different way. Therefore, the LDPC decoding operations before and after the sub LDPC decoding mode may progress in different way. That is, the parity check matrix H is modified to break the trapping set through the update operation to the check nodes and the variable nodes in the sub LDPC mode, the resumed LDPC decoding operation after the sub LDPC decoding mode may be successful in the resumed main LDPC mode.

Figure 8E:
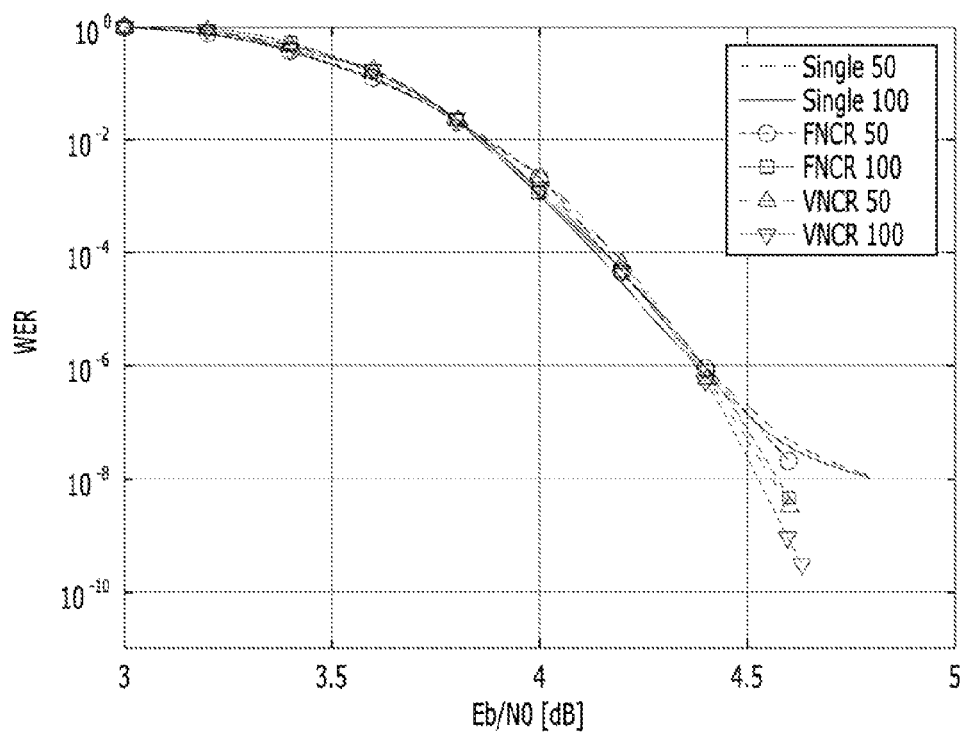
FIG. 8E is a simulation graph illustrating an operation of the LDPC decoder in accordance with an embodiment of the present invention.

FIG. 8E is a simulation graph illustrating an operation of the LDPC decoder 133 in accordance with an embodiment of the present invention.

FIG. 8E shows word error rates (WERs) according to Eb/N0 in the additive white gaussian noise channel (AWGNC) for three cases of a conventional LDPC decoder (represented by "Single 50" and "Single 100" in FIG. 8E), a first type of the LDPC decoder 133 (represented by "FNCR 50" and "FNCR 100" in FIG. 8E) arbitrarily selecting a predetermined number "$d_f$" (e.g., "$d_f$" is 3 in FIG. 8E) of ones among the check nodes 610 of the (2*t)-th level and a second type of the LDPC decoder 133 (represented by "VNCR 50" and "VNCR 100" in FIG. 8E) arbitrarily selecting some among the check nodes 610 of the (2*t)-th level according to the predetermined selection probability "$p_r$" (e.g., "$p_r$" is 0.7 in FIG. 8E). FIG. 8E shows the conventional LDPC decoder of 5-bit uniform quantization. As illustrated to FIG. 8E, when the number of iterations is 50, the WER decreases according to Eb/N0 in order of the conventional LDPC decoder (represented by "Single 5" FIG. 8E), the first type of the LDPC decoder 133 (represented by "FNCR 50" in FIG. 8E) and the second type of the LDPC decoder 133 (represented by "VNCR 50" in FIG. 8E). Also, when the number of iterations is 100, the WER decreases according to Eb/N0 in order of the conventional LDPC decoder (represented by "Single 100" in FIG. 8E), the first type of the LDPC decoder 133 (represented by "FNCR 100" in FIG. 8E) and the second type of the LDPC decoder 133 (represented by "VNCR 100" in FIG. 8E). Therefore as illustrated in FIG. 8E, the LDPC decoder 133 in accordance with an embodiment of the present invention is superior to the conventional LDPC decoder.

In accordance with an embodiment of the present invention, when the LDPC decoding unit 135 determines the original parity check matrix H to have the trapping set of the variable nodes and the check nodes, the LDPC decoder 133 may modify the original parity check matrix H into the modified parity check matrix H' in order to break the trapping set through the update operation to the check nodes and the variable nodes in the sub LDPC mode. Therefore, in accordance with an embodiment of the present invention, data stored in memory cells of the semiconductor memory device 200 may be precisely read through the LDPC decoding operation with the original parity check matrix H and the modified parity check matrix H'.

Although the disclosure is thoroughly and completely made with the example of the LDPC decoder 133 of the semiconductor memory system 10 in order to fully convey the scope of the present invention to those skilled in the art, the LDPC decoder 133 in accordance with an embodiment of the present invention may be applied to another system such as a communication system as well as the semiconductor memory system 10.

Figure 9:
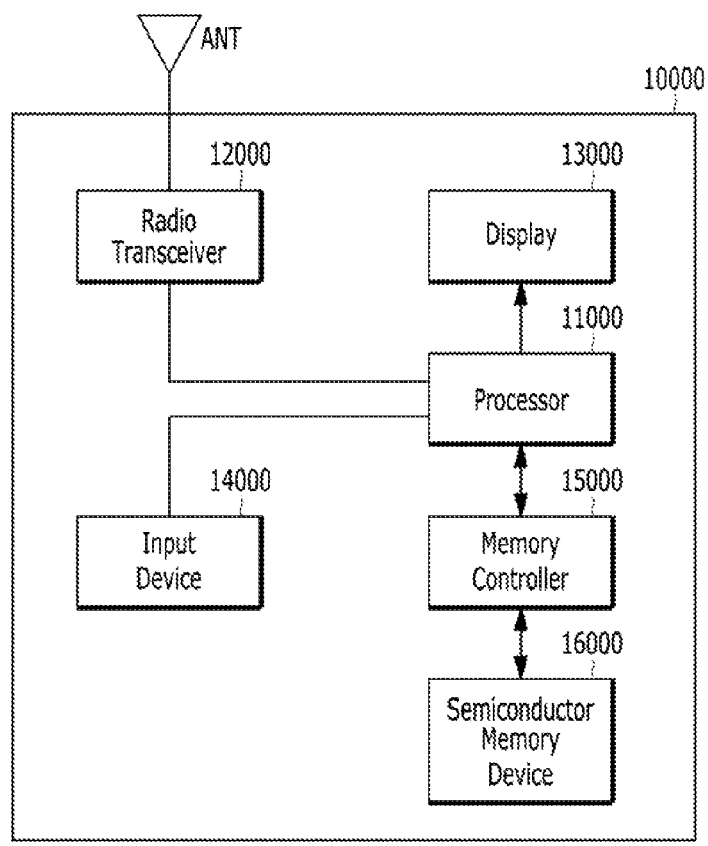
FIG. 9 is a block diagram schematically illustrating an electronic device including a semiconductor memory system in accordance with an embodiment of the present invention.

FIG. 9 is a block diagram schematically illustrating an electronic device 10000 including a memory controller 15000 and a semiconductor memory device 16000 in accordance with an embodiment of the present invention.

Referring to FIG. 9, the electronic device 10000 such as a cellular phone, a smart phone, or a tablet PC may include the semiconductor memory device 16000 implemented by a flash memory device and the memory controller 15000 to control the semiconductor memory device 16000.

The semiconductor memory device 16000 may correspond to the semiconductor memory device 200 described above with reference to FIGS. 3 to 4B. The semiconductor memory device 16000 may store random data.

The memory controller 15000 may correspond to the memory controller 100 described with reference to FIGS. 3 to 8E. The memory controller 15000 may be controlled by a processor 11000 which controls overall operations of the electronic device 10000.

Data stored in the semiconductor memory device 16000 may be displayed through a display 13000 under the control of the memory controller 15000. The memory controller 15000 operates under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000, and may be implemented by a pointing device such as a touch pad or a computer mouse, a key pad, or a keyboard.

The processor 11000 may control the display 13000 such that the data from the semiconductor memory device 16000, the radio signal from the radio transceiver 12000 or the data from the input device 14000 is displayed through the display 13000.

Figure 10:
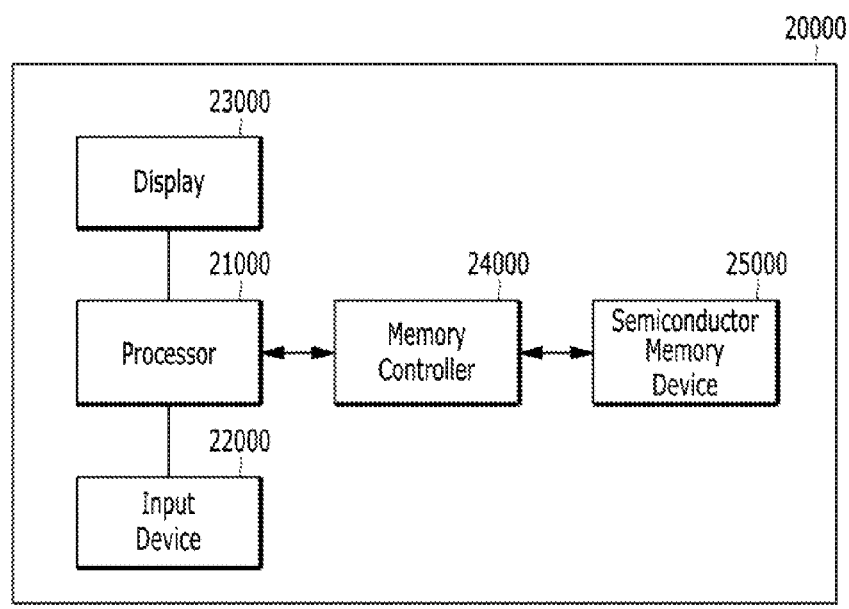
FIG. 10 is a block diagram schematically illustrating an electronic device including a semiconductor memory system in accordance with an embodiment of the present invention.

FIG. 10 is a block diagram schematically illustrating an electronic device 20000 including a memory controller 24000 and a semiconductor memory device 25000 in accordance with an embodiment of the present invention.

The memory controller 24000 and the semiconductor memory device 25000 may correspond to the memory controller 100 and the semiconductor memory device 200 described with reference to FIGS. 3 to 8E, respectively.

Referring to FIG. 10, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player, and may include the semiconductor memory device 25000, e.g., the flash memory device, and the memory controller 24000 to control operations of the semiconductor memory device 25000.

The electronic device 20000 may include a processor 21000 to control overall operations of the electronic device 20000. The memory controller 24000 may be controlled by the processor 21000.

The processor 21000 may display data stored in the semiconductor memory device 25000 through a display 23000 according to an input signal from an input device 22000. For example, the input device 22000 may be implemented by a pointing device such as a touch pad or a computer mouse, a key pad, or a keyboard.

Figure 11:
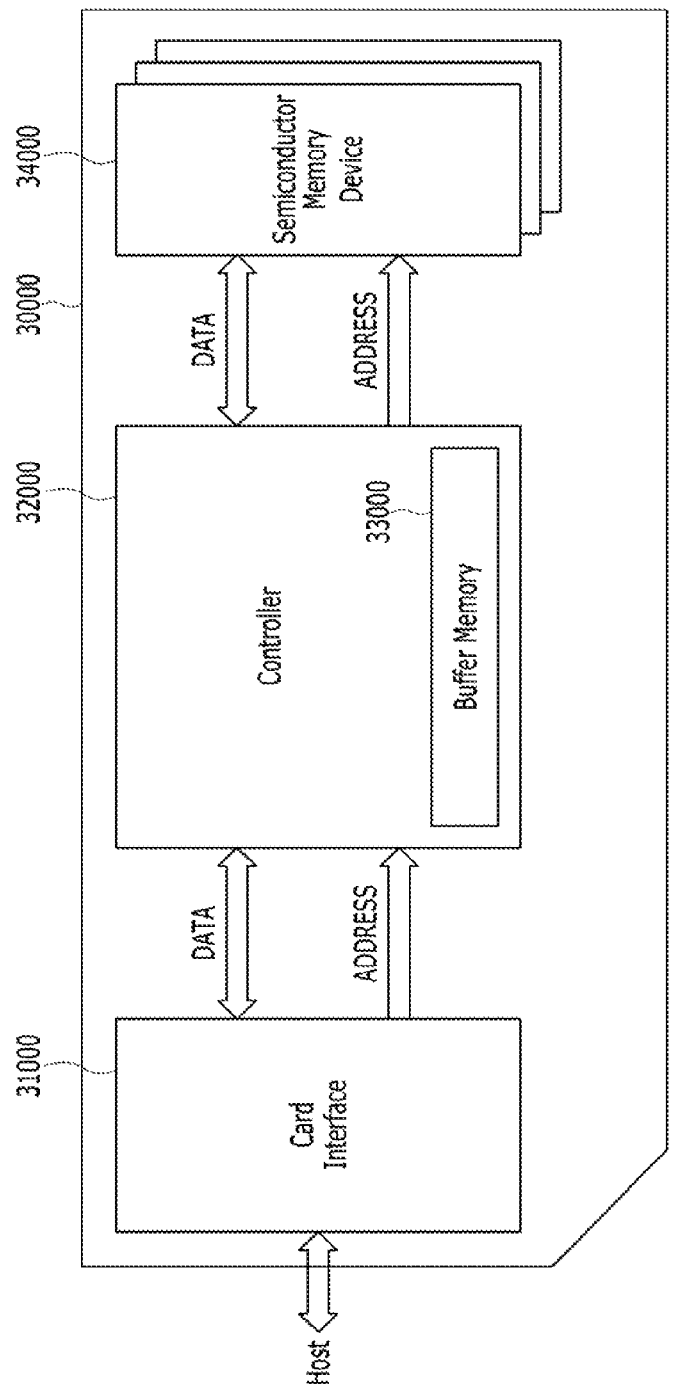
FIG. 11 is a block diagram schematically illustrating an electronic device including a semiconductor memory system in accordance with an embodiment of the present invention.

FIG. 11 is a block diagram schematically illustrating an electronic device 30000 including a controller 32000 and a semiconductor memory device 34000 in accordance with an embodiment of the present invention.

The controller 32000 and the semiconductor memory device 34000 may correspond to the memory controller 100 and the semiconductor memory device 200 described with reference to FIGS. 3 to 8E, respectively.

Referring to FIG. 11, the electronic device 30000 may include a card interface 31000, the controller 32000, and the semiconductor memory device 34000, for example, a flash memory device.

The electronic device 30000 may exchange data with a host through the card interface 31000. The card interface 31000 may be a secure digital (SD) card interface or a multi-media card (MMC) interface, which will not limit the scope of the present invention. The card interface 31000 may interface the host and the controller 32000 according to a communication protocol of the host capable of communicating with the electronic device 30000.

The controller 32000 may control an overall operation of the electronic device 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDS, may send it to the semiconductor memory device 34000. Further, the controller 32000 may receive or transfer data to be read or written through the data bus DATA connected with the card interface 31000 or the semiconductor memory device 34000.

When the electronic device 30000 is connected with the host such as a PC, a tablet PC, a digital camera, a digital audio player, a mobile phone, console video game hardware or a digital set-top box, the host may exchange data with the semiconductor memory device 34000 through the card interface 31000 and the controller 32000.

Figure 12:
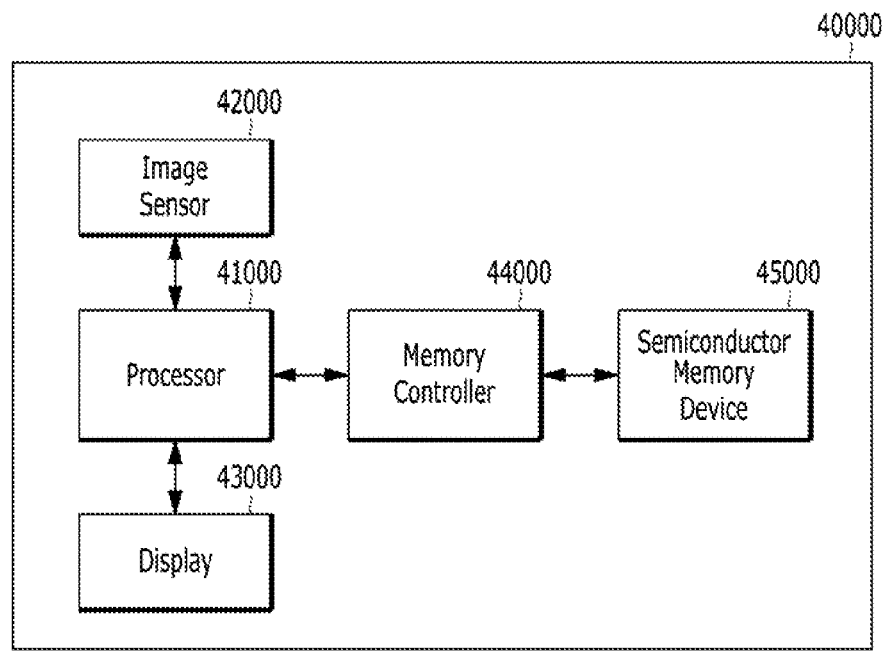
FIG. 12 is a block diagram schematically illustrating an electronic device including a semiconductor memory system in accordance with an embodiment of the present invention.

FIG. 12 is a block diagram schematically illustrating an electronic device 40000 including a memory controller 44000 and a semiconductor memory device 45000 in accordance with an embodiment of the present invention.

The memory controller 44000 and the semiconductor memory device 45000 may correspond to the memory controller 100 and the semiconductor memory device 200 described with reference to FIGS. 3 to 8E respectively.

Referring to FIG. 12 the electronic device 40000 may include the semiconductor memory device 45000, e.g., the flash memory device, the memory controller 44000 to control a data processing operation of the semiconductor memory device 45000, and a processor 41000 to control overall operations of the electronic device 40000.

Further, an image sensor 42000 of the electronic device 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

Figure 13:
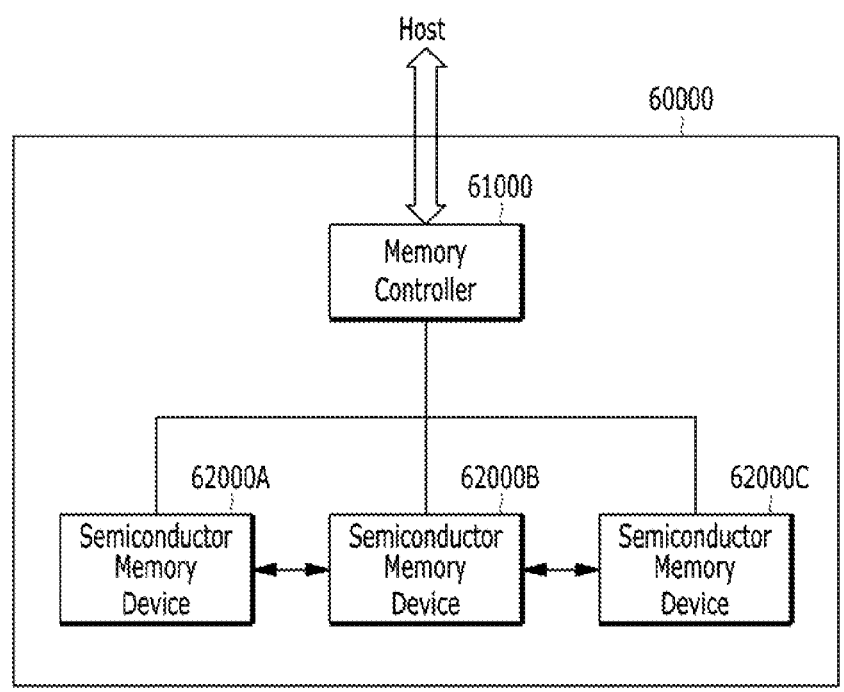
FIG. 13 is a block diagram schematically illustrating an electronic device including a semiconductor memory system in accordance with another embodiment of the present invention.

FIG. 13 is a block diagram schematically illustrating an electronic device 60000 including a memory controller 61000 and semiconductor memory devices 62000A, 62000B, and 62000C in accordance with an embodiment of the present invention.

The memory controller 61000 and each of the semiconductor memory devices 62000A, 62000B, and 62000C may correspond to the memory controller 100 and the semiconductor memory device 200 described with reference to FIGS. 3 to 8E, respectively.

Referring to FIG. 13, the electronic device 60000 may be implemented by a data storage device such as a solid state drive (SSD).

The electronic device 60000 may include the plurality of semiconductor memory devices 62000A, 62000B, and 62000C and the memory controller 61000 to control a data processing operation of each of the semiconductor memory devices 62000A, 62000B, and 62000C.

The electronic device 60000 may be implemented by a memory system or a memory module.

For example, the memory controller 61000 may be implemented outside or inside the electronic device 60000.

Figure 14:
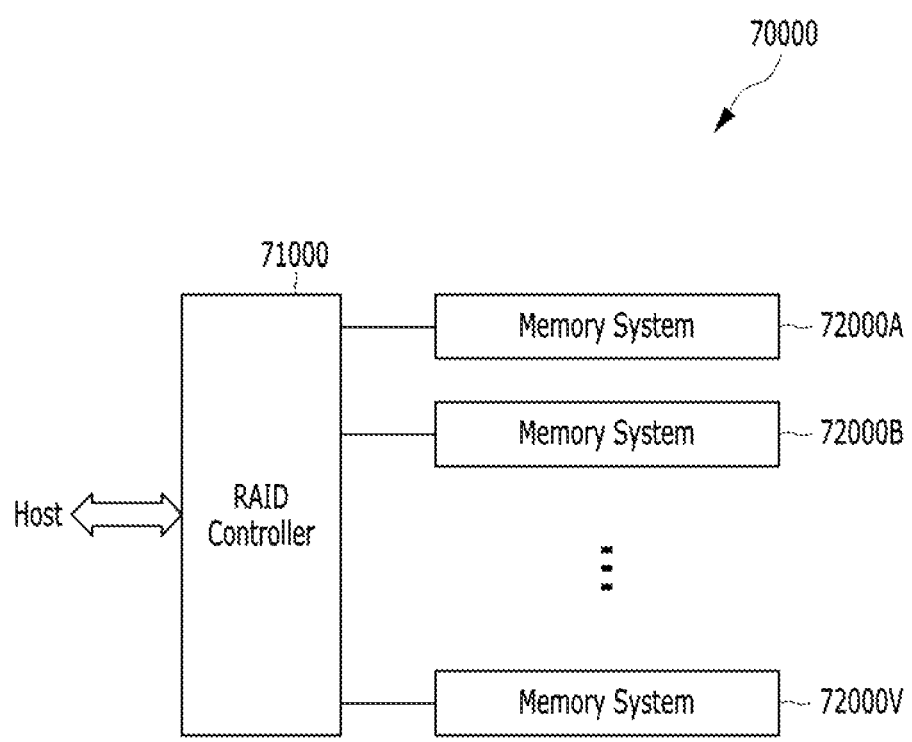
FIG. 14 is a block diagram of a data processing system including the electronic device shown in FIG. 13.

FIG. 14 is a block diagram of a data processing system including the electronic device 6000 described with reference to FIG. 13.

Referring to FIGS. 13 and 14, a data storage device 70000 may be implemented by a redundant array of independent disks (RAID) system. The data storage device 70000 may include a RAID controller 71000 and a plurality of memory systems 72000A to 72000N, where N is a natural number.

Each of the memory systems 72000A to 72000N may correspond to the electronic device 60000 described with reference to FIG. 13. The memory systems 72000A to 72000N may form a RAID array. The data storage device 70000 may be implemented by an SSD.

During a program operation, the RAID controller 71000 may output program data, which is output from a host to one of the memory systems 72000A to 72000N according to one selected from a plurality of RAID levels based on RAID level information output from the host.

During a read operation the RAID controller 71000 may transfer data, which is read from one of the memory systems 72000A to 72000N, to the host according to one of the RAID levels based on the RAID level information output from the host.

While the present invention has been described with respect to specific embodiments, it will be apparent to those skilled in the art that various changes and modifications may be made without departing from the spirit and scope of the invention as defined in the following claims.

What is claimed is:

1. An operation method for a low density parity check (LDPC) decoder comprising:
   performing, by a LDPC decoding circuit, an initial update operation to variable nodes by updating a codeword to the variable nodes;
   performing, by the LDPC decoding circuit, a decoding operation to the codeword based on an original parity check matrix;
   generating, by a parity check matrix modification circuit, when a number of unsatisfied syndrome checks (USCs) does not decrease below a predetermined number despite reaching a threshold iteration numbers of the decoding operation, a modified parity check matrix by changing data of rows of the original parity check matrix corresponding to check nodes, which are selected among a plurality of check nodes of $(2*t)$-th level in a $(2*t)$-level tree structure having one or more root nodes corresponding to the USCs, with dummy data,
   wherein the variable t is a separation value of a trapping set of the LDPC code when information of the trapping set is known, and has a value of '1' when information of the trapping set is not known;
   performing, by the LDPC decoding circuit, a node update operation including check node update and variable node update based on the modified parity check matrix; and
   performing, by the LDPC decoding circuit, a predetermined number of single iterations until the decoding operation is successful,
   wherein each single iteration includes performing the decoding operation, generating a modified parity check matrix, and performing the node update operation, and
   wherein the decoding operation is successful when a vector generated as a result of a syndrome check of the decoding operation does not include the USCs thereby decreasing word error rates which enables a semiconductor memory device to be accurately read.

2. The operation method of claim 1, wherein the generating the modified parity check matrix generates the modified parity check matrix by randomly selecting a predetermined number of check nodes among the plurality of check nodes of $(2*t)$-th level, which are linked to each of variable nodes of a $(2*t-1)$-th level through paths of edges in the $(2*t)$-level tree structure.

3. The operation method of claim 1, wherein the generating the modified parity check matrix generates the modified parity check matrix by randomly selecting one or more check nodes among the plurality of check nodes of $(2*t)$-th level, which are linked to each of variable nodes of a $(2*t-1)$-th level through paths of edges in the $(2*t)$-level tree structure, according to a predetermined selection probability.

4. The operation method of claim 1, wherein the codeword is a hard decision data.

5. The operation method of claim 1, wherein the codeword is a soft decision data.

6. A low density parity check (LDPC) decoder comprising:
   a LDPC decoding circuit for performing an initial update operation to variable nodes by updating a codeword to the variable nodes, and performing a decoding operation to the codeword based on an original parity check matrix; and a parity check matrix modification circuit for generating, when a number of unsatisfied syndrome checks (USCs) does not decrease below a predetermined number despite a threshold iteration numbers of the decoding operation, a modified parity check matrix by changing data of rows of the original parity check matrix corresponding to check nodes, which are selected among a plurality of check nodes of (2*t)-th level in a (2*t)-level tree structure having one ore more root nodes corresponding to the USCs, with dummy data, wherein variable t is a separation value of a trapping set of the LDPC code when information of the trapping set is known, and is a value of '1' when information of the trapping set is not known, wherein the LDPC decoding circuit performs a predetermined number of single iterations until the decoding operation is successful, wherein the single iterations includes the decoding operation and a node update operation including a check node update and a variable node update based on the modified parity check matrix, and wherein the LDPC decoding circuit determines the decoding operation is successful when a vector generated as a result of a syndrome check of the decoding operation does not include the USCs thereby decreasing word error rates which enables a semiconductor memory device to be accurately read.

7. The LDPC decoder of claim 6, wherein the parity check matrix modification circuit generates the modified parity check matrix by randomly selecting a predetermined number of check nodes among the plurality of check nodes of (2*t)-th level, which are linked to each of variable nodes of a (2*t−1)-th level through paths of edges in the (2*t)-level tree structure.

8. The LDPC decoder of claim 6, wherein the parity check matrix modification circuit generates the modified parity check matrix by randomly selecting one or more check nodes among the plurality of check nodes of (2*t)-th level, which are linked to each of variable nodes of a (2*t−1)-th level through paths of edges in the (2*t)-level tree structure, according to a predetermined selection probability.

9. The LDPC decoder of claim 6, wherein the codeword is a hard decision data.

10. The LDPC decoder of claim 6, wherein the codeword is a soft decision data.

11. A semiconductor memory system comprising:
a semiconductor memory device; and
a low density parity check (LDPC) decoder,
wherein the LDPC decoder includes:
a LDPC decoding circuit for performing an initial update operation to variable nodes by updating a codeword to the variable nodes, and performing a decoding operation to the codeword based on an original parity check matrix; and
a parity check matrix modification circuit for generating, when a number of unsatisfied syndrome checks USCs does not decrease below a predetermined number despite a threshold iteration numbers of the decoding operation, a modified parity check matrix by changing data of rows of the original parity check matrix corresponding to check nodes, which are selected among a plurality of check nodes of (2*t)-th level in a (2*t)-level tree structure having one or more root nodes corresponding to the USCs, with dummy data, wherein variable t is a separation value of a trapping set of the LDPC code when information of the trapping set is known, and is a value of '1' when information of the trapping set is not known, wherein the LDPC decoding circuit performs a predetermined number of single iterations until the decoding operation is successful, wherein the single iterations includes the decoding operation and a node update operation including a check node update and a variable node update based on the modified parity check matrix, and wherein the LDPC decoding circuit determines the decoding operation as successful when a vector generated as a result of a syndrome check of the decoding operation does not include the USCs thereby decreasing word error rates which enables a semiconductor memory device to be accurately read.

12. The semiconductor memory system of claim 11, wherein the parity check matrix modification circuit generates the modified parity check matrix by randomly selecting a predetermined number of check nodes among the plurality of check nodes of (2*t)-th level, which are linked to each of variable nodes of a (2*t−1)-th level through paths of edges in the (2*t)-level tree structure.

13. The semiconductor memory system of claim 11, wherein the parity check matrix circuit generates the modified parity check matrix by randomly selecting one or more check nodes among the plurality of check nodes of (2*t)-th level, which are linked to each of variable nodes of a (2*t−1)-th level through paths of edges in the (2*t)-level tree structure, according to a predetermined selection probability.

14. The semiconductor memory system of claim 11, wherein the codeword is a hard decision data.

15. The semiconductor memory system of claim 11, wherein the codeword is a soft decision data.

* * * * *